US012610753B2

(12) United States Patent
Sung et al.

(10) Patent No.: US 12,610,753 B2
(45) Date of Patent: Apr. 21, 2026

(54) STACKED RESISTIVE RANDOM-ACCESS MEMORY CROSS-POINT CELL

(71) Applicant: International Business Machines Corporation, Armonk, NY (US)

(72) Inventors: Min Gyu Sung, Latham, NY (US); Kangguo Cheng, Schenectady, NY (US); Julien Frougier, Albany, NY (US); Ruilong Xie, Niskayuna, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 672 days.

(21) Appl. No.: 18/186,229

(22) Filed: Mar. 20, 2023

(65) Prior Publication Data

US 2024/0324476 A1     Sep. 26, 2024

(51) Int. Cl.
| | |
|---|---|
| *H10N 70/00* | (2023.01) |
| *H10B 63/00* | (2023.01) |
| *H10B 80/00* | (2026.01) |
| *H10W 90/00* | (2026.01) |

(52) U.S. Cl.
CPC .......... *H10N 70/841* (2023.02); *H10B 63/30* (2023.02); *H10B 63/84* (2023.02); *H10B 80/00* (2023.02); *H10N 70/021* (2023.02); *H10N 70/061* (2023.02); *H10W 90/00* (2026.01)

(58) Field of Classification Search
CPC ....... H10N 70/841; H10B 63/30; H10B 80/00
See application file for complete search history.

(56) References Cited

U.S. PATENT DOCUMENTS

| | | | |
|---|---|---|---|
| 7,687,361 | B2 | 3/2010 | Jang |
| 8,207,557 | B2 | 6/2012 | Sills |
| 8,338,224 | B2 | 12/2012 | Yoon |
| 9,177,996 | B2 | 11/2015 | Pramanik |
| 9,368,554 | B2 | 6/2016 | Kau |
| 10,096,773 | B1 | 10/2018 | Ando |
| 10,439,134 | B2 | 10/2019 | Majhi |

(Continued)

OTHER PUBLICATIONS

Disclosed Anonymously, "Resistive RAM Conductive Filament Formation Enhancement by Topography," IPCOM000261358D, https://ip.com/IPCOM/000261358, Feb. 25, 2020, pp. 1-4.

(Continued)

*Primary Examiner* — Marvin Payen
(74) *Attorney, Agent, or Firm* — Edward J. Wixted, III

(57)     ABSTRACT

A three-dimensional semiconductor structure with a bottom electrode in an interlayer dielectric material. The bottom electrode material with a rectangular shape has a first notch is in a top portion of a portion of the bottom electrode material. The first notch occurs in an intersection of the bottom electrode material with a top electrode material. A dielectric material contacts the bottom electrode material and a top surface of the interlayer dielectric material. The dielectric material is between five sides of the bottom electrode material and the top electrode material in the intersection of the bottom electrode material with the top electrode material and has a large contact area with of the bottom electrode material and the top electrode. When the bottom electrode material is a word line and the top electrode material is a bit line, the three-dimensional structure is a ReRAM cross point cell.

20 Claims, 18 Drawing Sheets

(56) References Cited

U.S. PATENT DOCUMENTS

| | | | |
|---|---|---|---|
| 10,658,583 | B1 | 5/2020 | Li |
| 11,430,513 | B1 | 8/2022 | Seo |
| 11,481,611 | B2 | 10/2022 | Ando |
| 2022/0181389 | A1 | 6/2022 | Ando |
| 2024/0179924 | A1 | 5/2024 | Sung |

OTHER PUBLICATIONS

Disclosed Anonymously, "Process-Induced Forming of RRAM Device with Dummy CMP Structure," IPCOM000263964D, https://ip.com/IPCOM/000263964, Oct. 27, 2020, pp. 1-11.

Govoreanu et. al., "10×10nm2 Hf/HfOx crossbar resistive RAM with excellent performance, reliability and low-energy operation," 2011 International Electron Devices Meeting, 2011, pp. 31.6.1-31.6.4, doi: 10.1109/IEDM.2011.6131652.

Sung, et. al., "8th International Symposium on Advanced Gate Stack Technology", Sematech, Bolton Landing (USA), Oct. 19-21, 2011, pp. 1-20.

Vatto et. al., Analyzing Intel-Micron 3D XPoint: The Next Generation Non-Volatile Memory, AANANDTECH, The Technology, https://www.anandtech.com/show/9470/intel-and-micron-announce-3d-xpoint-nonvolatile-memory-technology-1000x-higher-performance-endurance-than-nand/2, Jul. 31, 2015, p. 1-10.

200A

200B

300A 5          5

4

3

300B

4

3

500A

6

4

3

500B

6

4

3

600A

8

6

4

3

600B

8

6

4

3

700A
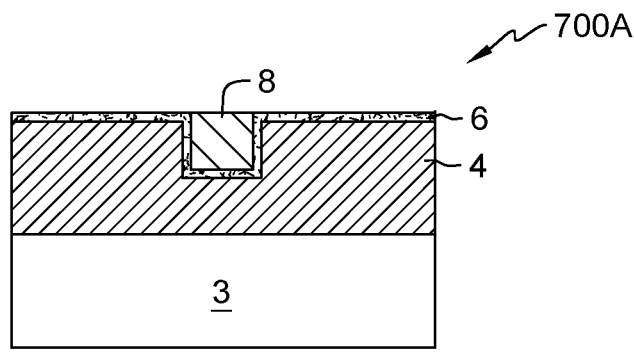
FIG. 7A
700B
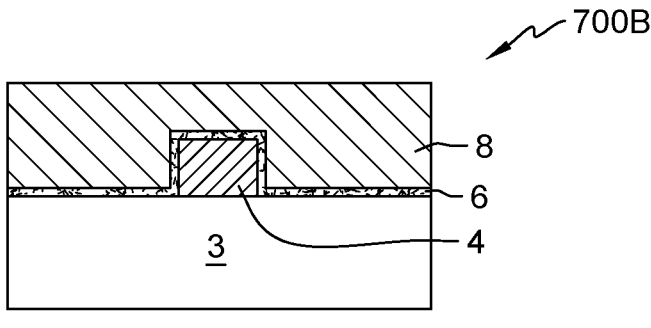
FIG. 7B
700C
FIG. 7C

1000A

1000B

1300A

1300B

STACKED RESISTIVE RANDOM-ACCESS MEMORY CROSS-POINT CELL

BACKGROUND

The present invention relates generally to the field of semiconductor device manufacture and more particularly to the formation of three-dimensional semiconductor structures for memory devices in crossbar arrays and metal-insulator-metal capacitors.

The amount of data processed is rapidly increasing at a rate higher than that of Moore's law. To meet this growing demand, in addition to conventional scaling, the semiconductor memory industry is exploring other options such as multi-level cells, three-dimensional stacking, and multi-layer structures to improve memory density.

Similarly, capacitors have inherent limitations for continued cell scaling. In order to ensure enough retention time after programming, the capacitance for a memory cell must be maintained at a relatively constant capacitance value with technology scaling. Since the memory cell capacitance is directly related to the surface area of the capacitor, as the memory cell and capacitor size shrink along the horizontal direction of the wafer, a decrease in capacitance typically occurs as the surface area of the capacitor decreases.

Emerging non-volatile memory technologies, such as resistive random-access memory (ReRAM or RRAM) and phase-change memory (PCM), capable of providing more complex memory device structures are becoming increasingly attractive for future systems. ReRAM is one promising candidate for the next generation of non-volatile memory due to its simple structure and its compatibility with complementary metal-oxide-semiconductor (CMOS) logic fabrication processes. Resistive random-access memory works by changing the resistance across a dielectric solid-state material. A typical ReRAM consists of a bottom electrode, a top electrode, and an oxide layer between the two electrodes.

In ReRAM devices, as the switching area of the dielectric material scales down, the forming voltage needed to initiate switching increases. In some cases, an additional external device providing a high forming voltage is required, resulting in additional power consumption and additional semiconductor real estate use. A device area penalty occurs if the ReRAM switching area is increased to reduce the forming voltage.

SUMMARY

Embodiments of the present invention provide a three-dimensional semiconductor structure with a bottom electrode material in an interlayer dielectric material. The bottom electrode material with a rectangular shape has a first notch is in a top portion of a portion of the bottom electrode material. The first notch occurs in an intersection of the bottom electrode material with a top electrode material. A dielectric material directly contacts the bottom electrode material and a top surface of the interlayer dielectric material. The dielectric material is between five sides of the portion of the bottom electrode material and a portion of the top electrode material in the intersection of the bottom electrode material with the top electrode material. In various embodiments, the dielectric material is a high-k dielectric material. The dielectric material has a large contact area with the portion of the bottom electrode material and the portion of the top electrode material in the intersection of the bottom electrode material with the top electrode material.

The three-dimensional semiconductor structure also includes the top electrode material directly on the dielectric material. The top electrode material has a rectangular shape with a second notch in a bottom portion of the top electrode material. The second notch extends around the dielectric material in the first notch. The second notch extending over the first notch occurs where the dielectric material is between the five sides of the portion of the bottom electrode material and the portion of a top electrode material in the intersection of the bottom electrode material with the top electrode material.

Three-dimensional semiconductor structure with orthogonally extending and intersecting portions of a top electrode material and a bottom electrode material increases the contact area of the dielectric material that is between the two electrode materials in the intersection of the top electrode material and the bottom electrode material. Providing more contact area of the dielectric material between the portions of the top electrode material and the bottom electrode material improves device performance without increasing the device footprint. As the drive to increasing chip performance and decreasing device feature continues, an ability to improve device performance without increasing the device footprint is desired.

Embodiments of the present invention disclose the three-dimensional semiconductor structure with the top electrode material that is a word line and the bottom electrode material that is a bit line. In these embodiments, the semiconductor structure is a resistive random-access memory (ReRAM) cross-point cell. The ReRAM cross-point cell has a large contact area of the dielectric material with the portion of the bottom electrode material and the portion of the top electrode material in the intersection of the bottom electrode material and the top electrode material. The large contact area of the dielectric material with the portions of the bottom electrode material and the portions of the top electrode material reduces the ReRAM cross point cell forming voltage compared to a conventional two-dimensional ReRAM cell.

Embodiments of the present invention also disclose that the three-dimensional semiconductor structure is a three-dimensional metal-insulator-metal (MIM) capacitor. The three-dimensional MIM capacitor with the dielectric material between the five sides of the portion of the bottom electrode material and the portion of the top electrode material provides a high capacitance without increasing MIM capacitor footprint.

Embodiments of the present invention provide a second three-dimensional semiconductor structure that is composed of two vertically stacked three-dimensional devices. The second three-dimensional semiconductor structure includes a first bottom electrode in a first interlayer dielectric material. The first bottom electrode has a rectangular shape with the first notch is in a top portion of the first bottom electrode in the intersection of the first bottom electrode and the top electrode. The semiconductor structure includes a first layer of a dielectric material that directly contacts the first bottom electrode and a top surface of the first interlayer dielectric material. The first layer of dielectric material is between five sides of the portion of the first bottom electrode and a bottom portion of a top electrode in the intersection of the first bottom electrode and the top electrode. The semiconductor structure includes the top electrode which is directly on the first layer of dielectric material. The top electrode with the rectangular shape has a second notch in the bottom portion of the top electrode. The second notch extends around the first dielectric material surrounding the first notch in the intersection of the first bottom electrode and the top electrode.

The second three-dimensional semiconductor structure also includes a second layer of the dielectric material which is directly on the top electrode and on a second layer of the interlayer dielectric material. The second layer of dielectric material between five sides of a top portion of the top electrode and a bottom portion of a second bottom electrode in an intersection of the top electrode and the second bottom electrode. The second bottom electrode has the rectangular shape with a third notch in the bottom portion of the second bottom electrode in the intersection of the top electrode and the second bottom electrode. The third notch surrounds a portion of the second layer of the dielectric material on the top portion of the top electrode material. The first dielectric material and the second dielectric material are a high-k dielectric material.

Embodiments of the present invention also include embodiments where the top electrode material is a bit line in the second three-dimensional semiconductor structure. In these embodiments, the first bottom electrode and the second bottom electrode are word lines. The bit line and the two word lines in the second three-dimensional semiconductor structure are a double-stacked resistive random-access memory (ReRAM) cross-point cell. Embodiments of the present inventions also provide the top electrode as a word line and the two bottom electrodes as bit lines of a double-stacked resistive random-access memory (ReRAM) cross-point cell.

The bottom ReRAM cross point cell of the double stacked ReRAM cross point cell is composed of the five sides of the first dielectric material between the portion of the first bottom electrode and the bottom portion of the top electrode in the intersection of the first bottom electrode and the top electrode. The top ReRAM cross point cell composed of the five sides of the second dielectric material between the top portion of the top electrode material and the bottom portion of the second bottom electrode. The bottom and the top stacked ReRAM cross point cells each have a large contact area of the dielectric material with the portion of the first bottom electrode material, the top portion of the portion of the top electrode, the bottom portion of the portion of the top electrode material, and the portion of the second bottom electrode. The doubled stacked ReRAM cross point cell has a low forming voltage without increasing the footprint of the double stacked ReRAM cross point cell compared to either a conventional ReRAM cell or the stacked ReRAM cross point cell.

Embodiments of the present invention also disclose that the second three-dimensional semiconductor structure is a double-stacked three-dimensional MIM capacitor with a high capacitance. A bottom three-dimensional MIM capacitor of the double stacked three-dimensional MIM capacitor is formed with the first bottom electrode covered by the first dielectric material in the intersection of the first bottom electrode with the top electrode. A top three-dimensional MIM capacitor of the double stacked MIM capacitor includes the second layer of the dielectric between five sides of the top portion of the top electrode and the second bottom electrode in the intersection of the top portion of the top electrode with the second bottom electrode. The double stacked three-dimensional MIM capacitor with ten sides of contact area where the dielectric material is between two metal electrode provides a higher capacitance than a conventional two-dimensional MIM capacitor.

BRIEF DESCRIPTION OF THE DRAWINGS

The above and other aspects, features, and advantages of various embodiments of the present invention will be more apparent from the following description taken in conjunction with the accompanying drawings.

FIG. 7A depicts a cross-sectional view of section A-A of the semiconductor structure FIG. 7 after performing a chemical mechanical polish (CMP), in accordance with an embodiment of the present invention.

FIG. 7B depicts a cross-sectional view of section B-B of the semiconductor structure of FIG. 7 after performing a chemical mechanical polish (CMP), in accordance with an embodiment of the present invention.

FIG. 7C depicts a cross-sectional view of section C-C of the semiconductor structure of FIG. 7 after performing a chemical mechanical polish (CMP), in accordance with an embodiment of the present invention.

DETAILED DESCRIPTION

Figure 1:
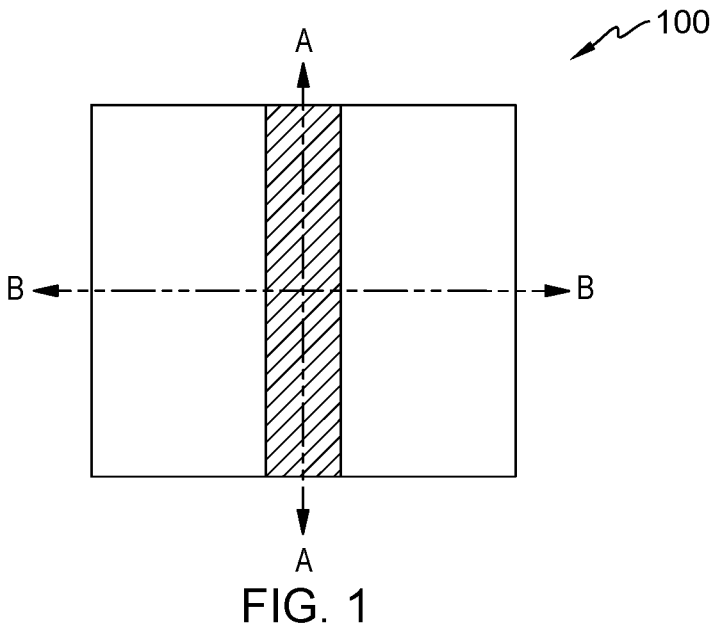
FIG. 1 depicts a top view of a semiconductor structure illustrating a bottom electrode material in a trench, in accordance with an embodiment of the present invention.

Embodiments of the present invention recognize that increasing system requirements require increasing memory requirements while desiring no increase in the required space used by the memory devices. Embodiments of the present invention recognize that switching in a conventional filamentary switching resistive random-access memory (Re-RAM) device requires a forming step to create the soft breakdown in a dielectric material. ReRAM is a type of non-volatile (NV) random-access (RAM) computer memory that works by changing the resistance across a dielectric solid-state material, often referred to as a memristor. ReRAM involves generating defects in a thin oxide layer, known as oxygen vacancies (oxide bond locations where the oxygen has been removed), which can subsequently charge and drift under an electric field. The motion of oxygen ions and vacancies in the oxide would be analogous to the motion of electrons and holes in a semiconductor. Embodiments of the present invention recognize that a broad range of materials can be used for ReRAM, however, high-k gate dielectric materials such as $HfO_2$ can be used as a low-voltage ReRAM.

Embodiments of the present invention recognize that as the switching area of the dielectric material scales down, the forming voltage needed to initiate switching increases. In some cases, an additional external device providing a high forming voltage is required, resulting in additional power consumption and additional semiconductor real estate use. If the ReRAM switching area increases to reduce the forming voltage, a device area penalty occurs. Increasing the device area increases the pitch between adjacent memory devices and can reduce device density. Embodiments of the present invention recognize that providing semiconductor device structures such as a three-dimensional ReRAM device structure that could provide additional switching area in the three-dimensional ReRAM device. Embodiments of the present invention recognize that a three-dimensional ReRAM device structure that could use a switching layer between the vertical sidewalls of the top and bottom electrodes to increase the switching material contact with the electrodes without increasing device footprint would be desirable. Providing additional area of contact between the electrodes and the ReRAM switching material (e.g., a high-k dielectric material) would reduce the required forming voltage of the ReRAM device. ReRAM devices structures providing a lower forming voltage without increasing ReRAM device footprint are desirable.

Additionally, embodiments of the present invention recognize that the capacitance for a memory cell must be maintained at a relatively constant capacitance value with technology scaling. Since the memory cell capacitance is directly related to the surface area of the capacitor, as the memory cell and capacitor size shrink along the horizontal direction of the wafer, a decrease in capacitance typically occurs as the surface area of the capacitor decreases. A three-dimensional capacitor structure that can increase capacitance without increasing the capacitor footprint.

Embodiments of the present invention disclose a method of forming three-dimensional semiconductor structures that includes etching a first rectangular trench in an interlayer dielectric (ILD) material and filling the first trench with an electrically conductive material or metal for the first electrode. The first electrode can be a bottom electrode. A second trench is etched orthogonally to the first trench. At the intersection of the first trench and the second trench, a top portion of the bottom electrode is removed forming a top notch in the bottom electrode. The remaining portion of the bottom electrode in the intersection of the first and second trenches rises above the bottom of the ILD in the second trench.

A high-k dielectric material is deposited over the semiconductor structure by ALD, CVD, or PVD, for example. The high-k dielectric material coats and covers four vertical sides of the bottom electrode and the horizontal surface or side of the raised portion of the bottom electrode remaining in the second trench. Five sides of the bottom electrode in the intersection of the first trench and the second trench are covered by the high-k dielectric material as are the other exposed surfaces of the semiconductor structure.

A second electrically conductive material or metal for a top electrode is deposited over the semiconductor structure filling the second trench. The high-k dielectric material, after the top electrode material deposition, is between five sides of the bottom electrode and the top electrode in the intersection of the top electrode and the bottom electrode (i.e., in the intersection of the first trench and the second trench). A polishing operation removes the excess top electrode material from the high-k dielectric material over the ILD material.

Embodiments of the present invention disclose the three-dimensional semiconductor structures for a ReRAM cross-point cell, a double-stacked ReRAM cross-point cell, a three-dimensional MIM capacitor, and a double-stacked three-dimensional MIM capacitor.

Embodiments of the present invention disclose the ReRAM cross-point cell formed with portions of a high-k dielectric material that reside between intersecting portions of the bottom electrode material and the top electrode material. Embodiments of the present invention provide a three-dimensional semiconductor structure for a ReRAM cross-point cell and a method of forming the ReRAM cross-point cell when the top electrode material is a word line, and the bottom electrode material is a bit line. Alternatively, embodiments of the present invention provide the ReRAM cross-point cell when the top electrode material is a bit line, and the bottom electrode material is a word line.

Embodiments of the present invention present the three-dimensional semiconductor structures that provide a large contact area of the high-k dielectric material between the top electrode material and the bottom electrode material. Providing a large contact area of the high-k dielectric material provides a lower forming voltage for switching in the ReRAM cross-point cell compared to conventional two-dimensional ReRAM cells. The ReRAM cross-point cell with the three-dimensional structure provides the high-k dielectric material that is between five sides of the bottom electrode material and the top electrode material in the intersection of the bottom electrode and the top electrode.

The contact area of the high-k dielectric material with the top and bottom electrodes occurs in the notch of the top surface of the bottom electrode material that is directly under and aligned with the notch in the bottom surface of the top electrode material. The high-k dielectric material is between the notch in the top of the bottom electrode and the notch in the bottom of the top electrode. Four vertical sides or sidewalls and a horizontal surface of the bottom electrode material are covered by the high-k dielectric material. The high-k dielectric can be between the top electrode material and the bottom electrode material in the intersection of the bottom electrode material filling a first trench and the top electrode material filling a second trench in the ILD material. In this way, the two vertical sidewalls of the notch in the bottom surface of the top electrode material, the horizontal surface of the notch in the bottom surface of the top electrode material, and the two vertical sidewalls of the notch in the top surface of the bottom electrode material create the five sides or five contact areas where the high-k dielectric material is between and in direct contact with portions of both the top electrode material and the bottom electrode material in the ReRAM cross-point cell. The horizontal surface of the notch in the top electrode material and the horizontal surface of the notch is the bottom electrode material is the same surface.

The dielectric material contact area between five sides of the two electrodes in the ReRAM cross-point cell of the present invention is larger than the contact area of the dielectric material with electrodes in a typical two-dimensional ReRAM. Increasing the surface area contact between the high-k dielectric material and the top and bottom electrodes provides a low forming voltage of the ReRAM cross-point cell.

Embodiments of the present invention provide the ReRAM cross-point cell can reduce the required ReRAM cross-point cell footprint (e.g., the horizontal area or pitch between adjacent ReRAM cross-point cells) compared to a conventional two-dimensional ReRAM device with the same or similar forming voltage. Alternatively, the ReRAM cross-point cells disclosed herein using a three-dimensional structure can reduce the forming voltage of the ReRAM cross-point cell compared to a conventional two-dimensional ReRAM cell with the same footprint. In some embodiments, both the forming voltage and the pitch between adjacent ReRAM cross-point cell can be reduced compared to a conventional two-dimensional ReRAM cell.

The double-stacked ReRAM cross-point cell disclosed by embodiments of the present invention further increases the contact area between the high-k dielectric material and the three electrodes (i.e., two bottom electrodes and the top electrode) with the addition of a second layer of the high-k dielectric material over the top portion of the top electrode and a portion of the second layer of ILD, and a second bottom electrode over a portion of the second layer of high-k dielectric material.

Five portions of the first layer of the high-k dielectric are between the bottom portion of the top electrode and the top portion of the first bottom electrode in the intersection of the top electrode and the bottom electrode. The intersection of the first bottom electrode and the top electrode is a bottom ReRAM cross-point cell.

The second layer of high-k dielectric material resides between the top portion of the top electrode and the bottom portion of the second bottom electrode at the intersection of the top electrode with the second bottom electrode. There are five portions of the second layer of the high-k dielectric between the top portion of the top electrode and the second bottom electrode at the intersection of the top electrode with the second bottom electrode. The five portions of the second layer of the high-k dielectric between the top portion of the top electrode and the second bottom electrode at the intersection of the top electrode with the second bottom electrode is a top ReRAM cross-point cell in the double-stacked ReRAM cross-point cell.

In this way, the double-stacked ReRAM cross-point cell can provide double the contact area between the high-k dielectric material and the top electrode and the two bottom electrodes compared to the ReRAM cross-point cell. The double-stacked ReRAM cross point cell provides five portions or sides of the first layer of the high-k dielectric between the bottom portion of the top electrode and the top portion of the first bottom electrode in the bottom ReRAM cross point cell and five portions of the second layer of the high-k dielectric between the top portion of the top electrode and the second bottom electrode at the intersection of the top electrode in the top ReRAM cross-point cell. The double-stacked ReRAM cross-point cell has ten portions of the high-k dielectric material with the three electrodes and provides a low forming voltage for the double-stacked ReRAM cross-point cell.

Alternatively, when the double-stacked ReRAM cross-point cell is compared to the ReRAM cross-point cell or a conventional two-dimensional ReRAM device, the double-stacked ReRAM cross-point cell can provide a reduced pitch between adjacent double-stacked ReRAM cross-point cells compared to either a conventional two-dimensional ReRAM device or the ReRAM cross-point cell (i.e., not stacked) with the same forming voltage.

Embodiments of the present invention provide a double-stacked ReRAM crossbar array when several of the ReRAM cross-point cells are formed on each of the bottom electrodes and the top electrodes as they extend orthogonally.

Embodiments of the present invention also disclose a three-dimensional metal-insulator-metal (MIM) capacitor. In the three-dimensional MIM capacitor, the high-k dielectric material is the insulator that is sandwiched between two metal plates that are named a top electrode material and a bottom electrode material hereinafter. Five sides of a contact area of the dielectric material with both the top electrode material and bottom electrode material provide more contact area between the two metal layers and insulator (i.e., high-k dielectric material) of the three-dimensional MIM capacitor compared to a conventional two-dimensional MIM and therefore, provides increased capacitance without increasing the footprint of the MIM capacitor. Similarly, embodiments of the present invention disclose a double-stacked three-dimensional MIM capacitor that provides twice the contact area between two layers of the dielectric material of the MIM capacitor and three metal layers (e.g., a first bottom electrode material, a top electrode material, and top bottom electrode material form the three metal layers) to further increase the capacitance provided by the double-stacked three-dimensional MIM capacitor compared to a three-dimensional MIM capacitor with a similar footprint. Several of the three-dimensional MIM capacitors can be connected by the top metal (e.g., also called a top electrode) that is running orthogonally to the bottom metal (e.g., also called the bottom electrode) to form three-dimensional MIM capacitor crossbar array. Similarly, several of the double stacked three-dimensional MIM capacitors can be joined to form a double stacked three-dimensional MIM capacitor crossbar array.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Some of the process steps, depicted, can be combined as an integrated process step. In addition, descriptions of well-known functions and constructions may be omitted for clarity and conciseness.

The terms and words used in the following description and claims are not limited to the bibliographical meanings but are merely used to enable a clear and consistent understanding of the invention. Accordingly, it should be apparent to those skilled in the art that the following description of exemplary embodiments of the present invention is provided for illustration purposes only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces unless the context clearly dictates otherwise.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" or "contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Detailed embodiments of the claimed structures and methods are disclosed herein. The method steps described below do not form a complete process flow for manufacturing integrated circuits on semiconductor chips. The present embodiments can be practiced in conjunction with the integrated circuit fabrication techniques for semiconductor chips and devices currently used in the art, and only so much of the commonly practiced process steps are included as are necessary for an understanding of the described embodiments. The figures represent cross-section portions of a semiconductor chip or a substrate, such as a semiconductor wafer during fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment," etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Reference will now be made in detail to the embodiments of the present invention, examples of which are illustrated in the accompanying drawings, wherein like reference numerals refer to like elements throughout.

FIG. 1 depicts a top view of semiconductor structure 100 depicting bottom electrode material 4 in a trench in ILD 3, in accordance with an embodiment of the present invention. As depicted, FIG. 1 includes ILD 3 and bottom electrode material 4. Using known damascene processes, a trench is etched in ILD 3 and is filled with bottom electrode material 4. For example, using a chemical mechanical polish (CMP), the excess electrode material is removed from the top surface of ILD 3 to form a line of bottom electrode material 4 as depicted in FIG. 1. Also illustrated in FIG. 1 are locations of cross-sections A-A and B-B. The location of cross-sections A-A and B-B remains the same for the figures depicted in the current invention.

Figure 1A:
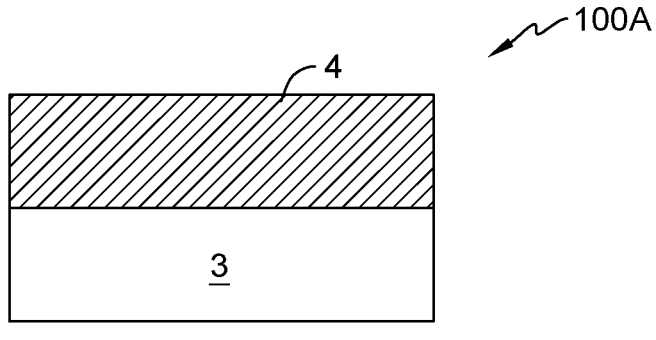
FIG. 1A depicts a cross-sectional view of section A-A of the semiconductor structure after depositing the bottom electrode material in an interlayer dielectric material (ILD), in accordance with an embodiment of the present invention.

FIG. 1A depicts a cross-sectional view 100A of section A-A of semiconductor structure 100 after depositing bottom electrode material 4, in accordance with an embodiment of the present invention. As depicted, FIG. 1A includes a portion of bottom electrode material 4 on ILD 3. FIG. 1A depicts bottom electrode material 4 above ILD 3 in the location of the A-A cross-section of FIG. 1.

ILD 3 can be any suitable interlayer dielectric material such as but not limited to $SiO_2$. Bottom electrode material 4 can be any electrode material used in semiconductor devices. Bottom electrode material 4 may be composed of an electrically conductive electrode material such as but not limited to Ta, TaN, Ti, TiN, Ru, RuN, RuTa, Cu, Co, W, WN, Al, AlC, graphene, or any combination thereof. In some embodiments, bottom electrode material 4 is any electrically conductive material such as any of the electrode materials for a metal layer of a metal-insulator-metal (MIM) capacitor. In various embodiments, bottom electrode material 4 will be a word line or a bit line in a ReRAM cell after patterning. Bottom electrode material 4 may be deposited by one or more of atomic layer deposition (ALD), chemical vapor deposition (CVD), physical vapor deposition (PVD), electroplating, electroless plating, or another suitable deposition process.

Figure 1B:
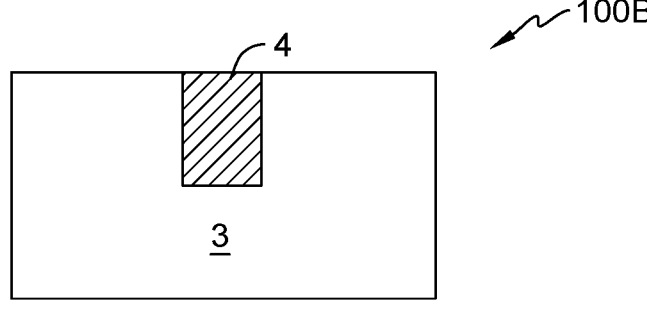
FIG. 1B depicts a cross-sectional view of section B-B of the semiconductor structure after depositing the bottom electrode material, in accordance with an embodiment of the present invention.

The semiconductor structure of FIG. 1A and FIG. 1B can be portions of a middle-of-line (MOL) semiconductor structure or a back-end-of-line (BEOL) semiconductor structure that resides above a semiconductor substrate (not depicted) and one or metal layers (not depicted). For example, the semiconductor structure of FIG. 1A and FIG. 1B may reside above or in an M1 metal layer. Semiconductor structure 100A and 100B may reside above one or more front-end-of-line (FEOL) semiconductor devices (not depicted).

FIG. 1B depicts a cross-sectional view 100B of section B-B of semiconductor structure 100 after depositing bottom electrode material 4, in accordance with an embodiment of the present invention. As depicted, FIG. 1B includes a portion of bottom electrode material 4 in the trench formed in ILD 3. In FIG. 1B, bottom electrode material 4 in the trench is a rectangular shape and is a portion of a line or a rectangular-shaped bar of bottom electrode material 4.

Figure 2A:
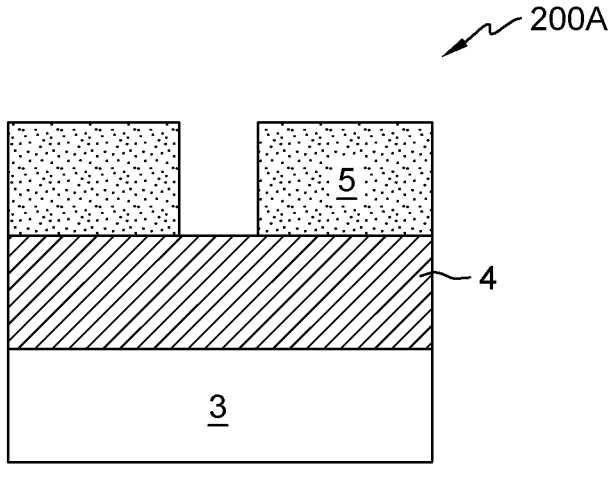
FIG. 2A depicts a cross-sectional view of section A-A of the semiconductor structure after depositing and patterning an optical planarization layer (OPL), in accordance with an embodiment of the present invention.

FIG. 2A depicts a cross-sectional view 200A of section A-A of the semiconductor structure after patterning OPL 5, in accordance with an embodiment of the present invention. As depicted, FIG. 2A includes the elements of FIG. 1A and OPL 5. A layer of OPL is deposited over semiconductor structure 100 and patterned to expose a portion of bottom electrode material 4. As depicted, the portion of bottom electrode material 4 exposed is in a central area of bottom electrode material 4. As depicted in FIG. 1, the center portion of bottom electrode material 4 corresponds with the location of cross-section B-B in FIG. 1.

Figure 2B:
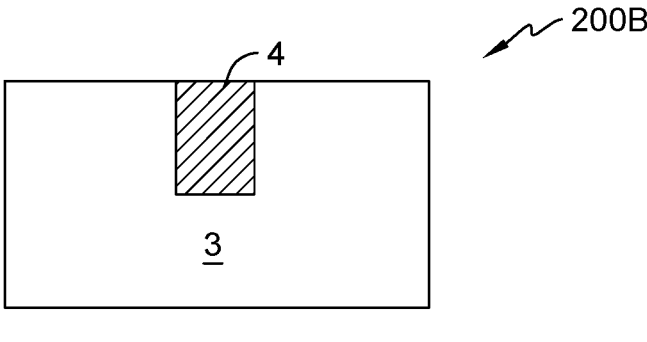
FIG. 2B depicts a cross-sectional view of section B-B of the semiconductor structure after depositing and patterning the OPL, in accordance with an embodiment of the present invention.

FIG. 2B depicts a cross-sectional view 200B of section B-B of the semiconductor structure after depositing and patterning OPL 5, in accordance with an embodiment of the present invention. As depicted, FIG. 2B is essentially the same as FIG. 1B.

Figures 3A, 3B:
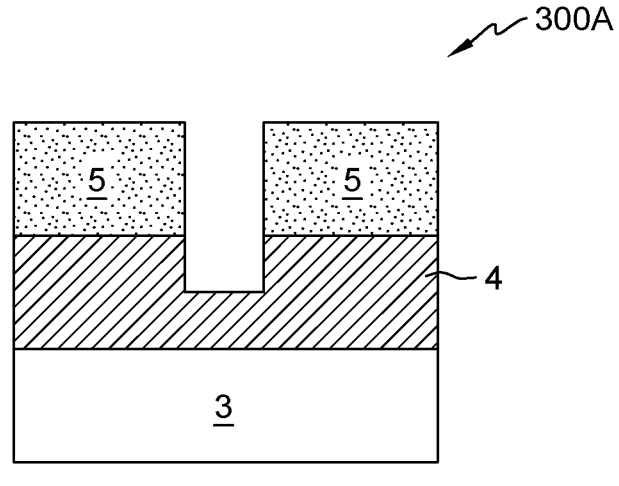
FIG. 3A depicts a cross-sectional view of section A-A of the semiconductor structure after recessing the bottom electrode and the interlayer dielectric (ILD), in accordance with an embodiment of the present invention.
FIG. 3B depicts a cross-sectional view of section B-B of the semiconductor structure after recessing the bottom electrode and ILD, in accordance with an embodiment of the present invention.

FIG. 3A depicts a cross-sectional view 300A of section A-A of the semiconductor structure after recessing a portion of bottom electrode material 4 and ILD 3, in accordance with an embodiment of the present invention. As depicted, FIG. 3A includes ILD 3, OPL 5, and a remaining portion of bottom electrode material 4 above ILD 3. In FIG. 3A, the exposed center portion of bottom electrode material 4 not covered by OPL 5 is removed. For example, using a dry etching process such as but not limited to reactive ion etch (RIE), a top portion of bottom electrode material 4 can be removed forming a notch in the top portion of bottom electrode material 4. For example, 20~100 nm of the top portion of bottom electrode material 4 may be removed but the removed portion is not limited to this depth. Typically, the width of a second trench formed by the removal of the top of bottom electrode material 4 can be 20 nm to 100 nm wide but is not limited to this width. The etching process forms a second trench extending orthogonally to the first trench of FIG. 1.

FIG. 3B depicts a cross-sectional view 300B of section B-B of the semiconductor structure after recessing bottom electrode material 4 and recessing ILD 3, in accordance with an embodiment of the present invention. As depicted, FIG. 3B includes a remaining portion of ILD 3 and bottom electrode material 4. As depicted in FIGS. 3A and 3B, a portion of bottom electrode material 4 in the second trench can be removed using known semiconductor etching processes such as but not limited to reactive ion etch (RIE). After etching, the exposed top portion of ILD 3 can be recessed around the remaining portion of bottom electrode material 4 (e.g., using a selective wet or dry etching process). After removing the portions of bottom electrode material 4 and ILD 3, the second trench is formed along and parallel to the B-B cross-section depicted in FIG. 1.

As depicted in FIG. 3B, the remaining portion of bottom electrode material 4 is in a center area of ILD 3 (e.g., corresponding to the center portions of FIG. 3B and FIG. 3A where cross-section A-A intersects with cross-section B-B and the first trench intersects with the second trench). For example, the height of the remaining portion of bottom electrode material 4 can be but is not limited to 20 to 100 nm.

Figure 4:
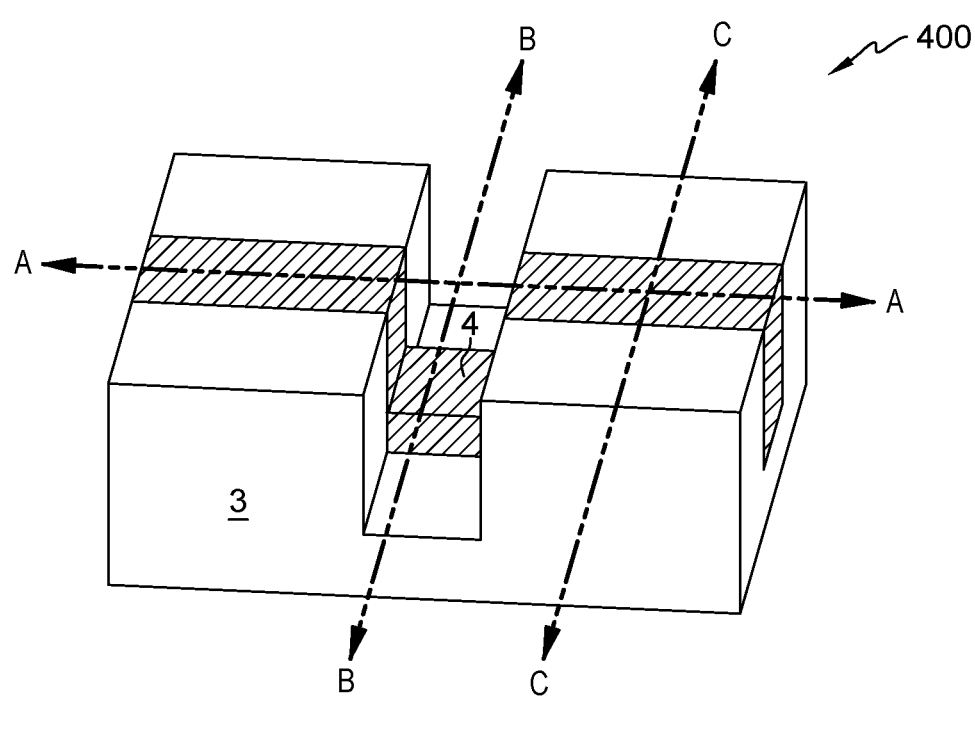
FIG. 4 depicts a three-dimensional isometric of the semiconductor structure after removing the OPL, in accordance with an embodiment of the present invention.

FIG. 4 depicts a three-dimensional isometric illustration of semiconductor structure 400 after removing OPL 5, in accordance with an embodiment of the present invention. After removing OPL 5, the three-dimensional isometric illustration of semiconductor structure 400 includes a location of cross-section A-A, cross-section B-B, and cross-section C-C. The intersection of cross-section A-A and cross-section B-B in FIGS. 4-7B is the intersection of bottom electrode material 4 in the first trench and the second trench where in later process steps depicted in FIGS. 5-7, the second trench is covered with dielectric material 6 and filled with top electrode material 8. The center portion of each of FIGS. 4, 4A, 4B, 5A, 5B, 6A, 6B, 7, 7A, and 7B is the intersection of cross-section A-A and cross-section B-B that is also the intersection of bottom electrode material 4 and top electrode material 8 depicted later in FIGS. 6A-7B.

FIG. 4 depicts the first trench in ILD 3 extending from the right to the left in the top surface of semiconductor structure 100 filled in part with the remaining portion of bottom electrode material 4, the second trench orthogonal to the first trench. The center portion of the second trench creates the notch in a top center portion of bottom electrode material 4 in the intersection of the first trench and the second trench. As depicted, FIG. 4 includes ILD 3 and bottom electrode material 4.

The second trench can be a rectangular-shaped trench with a raised portion of bottom electrode material 4 in the center. The second trench is through and parallel to cross-section B-B as illustrated in FIG. 4. The remaining portion of bottom electrode material 4 in the intersection of the first trench and the second trench forms a rectangular-shaped portion of bottom electrode material 4 although in other shaped portions of bottom electrode material 4 could be formed.

As depicted in FIG. 4, the exposed center portions of bottom electrode material 4 in the intersection of the two trenches include the top horizontal surface of the recessed portion or notch in the line of bottom electrode material 4, two vertical sides or sidewall of bottom electrode material above the horizontal surface of the recessed portion of bottom electrode material 4 (the second side of the vertical sidewall of the portion of bottom electrode material 4 is hidden in the isometric illustration), and two vertical sides of the recessed bottom electrode material 4 that rise above the bottom surface of ILD 3 in the second trench. As depicted in FIG. 4, after forming the second trench, five surfaces or sides of bottom electrode material 4 are exposed in the center portion of FIG. 4.

Figure 4A:
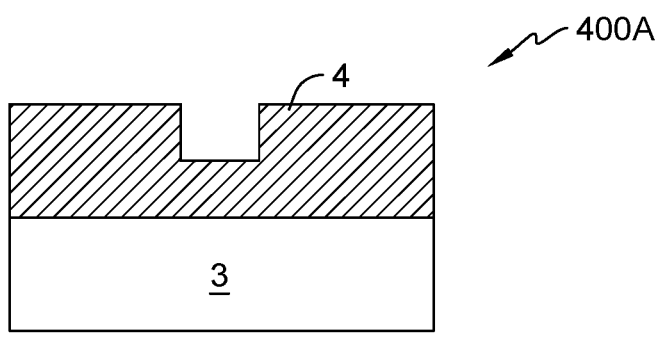
FIG. 4A depicts a cross-sectional view of section A-A of the semiconductor structure after removing the OPL, in accordance with an embodiment of the present invention.

FIG. 4A depicts a cross-sectional view 400A of section A-A of the semiconductor structure after removing OPL 5, in accordance with an embodiment of the present invention. As depicted, FIG. 4A includes ILD 3 and bottom electrode material 4. The portions of OPL 5 depicted in FIG. 3A are removed. The notch in the top surface of bottom electrode material 4 indicates the location of the second trench (e.g., the second trench parallel to cross-section B-B as depicted in FIG. 4). The notch also corresponds to the raised rectangular portion of bottom electrode material 4 illustrated in FIG. 4 and later in FIG. 4B.

Figure 4B:
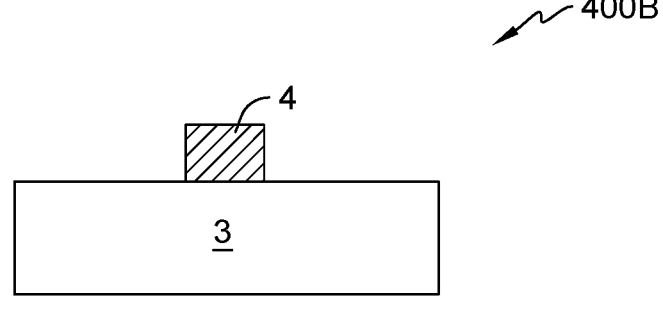
FIG. 4B depicts a cross-sectional view of section B-B of the semiconductor structure after removing the OPL, in accordance with an embodiment of the present invention.

FIG. 4B depicts a cross-sectional view 400B of section B-B of the semiconductor structure after removing OPL 5, in accordance with an embodiment of the present invention. As depicted, FIG. 4B includes ILD 3 and a portion of bottom electrode material 4 in the center of FIG. 4B. FIG. 4B is essentially the same as FIG. 3B.

Figure 4C:
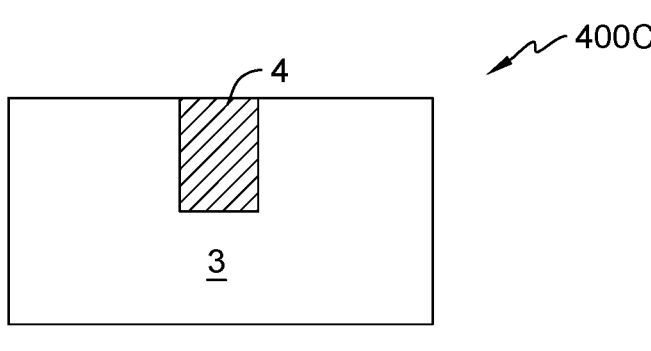
FIG. 4C depicts a cross-sectional view of section C-C of the semiconductor structure after removing the OPL, in accordance with an embodiment of the present invention.

FIG. 4C depicts a cross-sectional view 400C of cross-section C-C of the semiconductor structure after removing the OPL, in accordance with an embodiment of the present invention. As depicted in FIG. 4, the location of cross-section C-C is parallel and to the right of cross-section B-B. As depicted, FIG. 4C includes ILD 3 with a portion of the line of bottom electrode material 4.

Figure 5A:
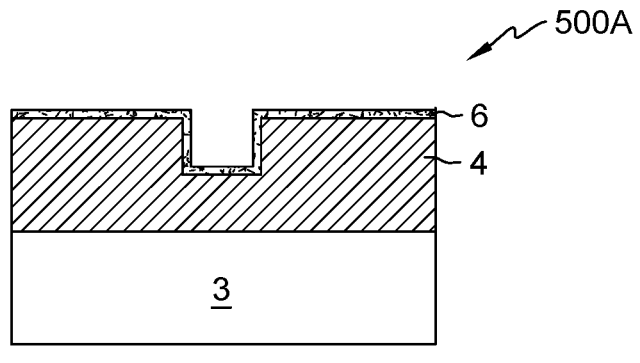
FIG. 5A depicts a cross-sectional view of section A-A of the semiconductor structure after depositing a layer of dielectric material, in accordance with an embodiment of the present invention.

FIG. 5A depicts a cross-sectional view 500A of section A-A of the semiconductor structure after depositing a layer of dielectric material 6, in accordance with an embodiment of the present invention. As depicted, FIG. 5A includes a layer of dielectric material 6 deposited on the top surface of FIG. 4A. Dielectric material 6 can be deposited using known deposition processes such as ALD. As depicted in FIG. 5A, dielectric material 6 is on the top surface of bottom electrode material 4, is on the two sidewalls of the notch in the center portion of the bottom dielectric material 4, and the bottom surface of the notch in the top center portion of bottom dielectric material 4.

In various embodiments, dielectric material 6 is a dielectric material. For example, dielectric material 6 can be any high-k or ultra-high-k dielectric material such as but not limited to $HfO_2$, AlO, ZrO, or TaO. A high-k dielectric material has a dielectric constant that is greater than 3.9. In some embodiments, dielectric material 6 has a dielectric constant greater than 10. In an embodiment, dielectric material 6 is composed of a super high-k dielectric material (e.g., $CaCu_2Ti_3O_4$ or $LaSrNi_4O_{12}$). In some embodiments, a selector material (not specifically depicted in FIG. 5A) is deposited over dielectric material 6. The optional selector material when included with dielectric material 6 can be a layer of Sb, N-doped Se-rich GeSe, or SiTe. As known to one skilled in the art, selector materials in emerging non-volatile memory devices such as ReRAM devices enhance ovonic threshold switching (OTS) in order to prevent sneak current during sensing operation in a crossbar array structure. Dielectric material 6 and the selector material (optional) can be deposited by a deposition process such as ALD, CVD, PECVD, PVD, or other suitable semiconductor material deposition process.

As depicted in FIG. 5A, the exposed surfaces of bottom electrode material 4 are covered with dielectric material 6. The two vertical sides of the center notch extending in bottom electrode material 4 down from the top surface of bottom electrode material 4 are covered by dielectric material 6 as is the top surface of bottom electrode material 4. The notch in the center of the top surface of bottom electrode material 4 is at the intersection of the first trench and the second trench (e.g., under the intersection of the lines A-A and B-B in FIG. 4).

Figure 5B:
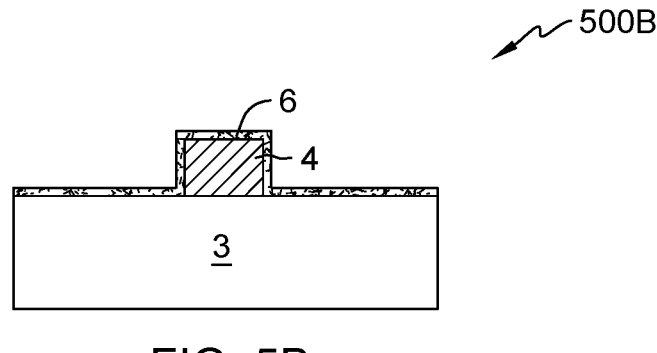
FIG. 5B depicts a cross-sectional view of section B-B of the semiconductor structure after depositing a layer of dielectric material, in accordance with an embodiment of the present invention.

FIG. 5B depicts a cross-sectional view 500B of section B-B of the semiconductor structure after depositing a layer of dielectric material 6, in accordance with an embodiment of the present invention. As depicted, FIG. 5B includes dielectric material 6, ILD 3, and bottom electrode material 4. The layer of dielectric material 6 is deposited over the top surface and sidewalls of the raised portion of bottom electrode material 4 and over the exposed top surface of ILD 3. The portion of bottom electrode material 4 is depicted in the center of FIG. 5B resides on ILD 3. The center of FIGS. 5B and 5A is the intersection of top electrode material 8 in the second trench with bottom electrode material 4 in the first trench. As depicted in FIG. 5B, dielectric material 6 is on the top surface of the portion of bottom electrode material 4 above ILD 3 and the two sidewalls of the portion of the bottom electrode material 4 above ILD 3. The top surface of bottom electrode material 4 is the bottom surface of the notch in bottom electrode material 4 in FIG. 5A.

Figures 6A, 6B:
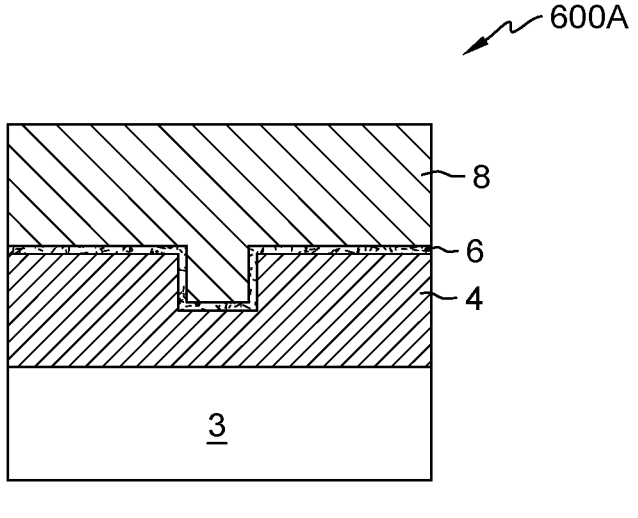
FIG. 6A depicts a cross-sectional view of section A-A of the semiconductor structure after depositing a layer of electrode material for a top electrode, in accordance with an embodiment of the present invention.
FIG. 6B depicts a cross-sectional view of section B-B of the semiconductor structure after depositing a layer of electrode material for a top electrode in accordance with an embodiment of the present invention.

FIG. 6A depicts a cross-sectional view 600A of section A-A of the semiconductor structure after depositing a layer of top electrode material 8, in accordance with an embodiment of the present invention. As depicted, FIG. 6A includes top electrode material 8 on dielectric material 6, bottom electrode material 4 under dielectric material 6, and ILD 3 under bottom electrode material 4. As depicted in FIG. 6A, top electrode material 8 is directly on the top surface of dielectric material 6. The downward extension of top electrode material 8 corresponds to and is vertically aligned with the raised or remaining portion of bottom electrode material 4 in FIG. 6B.

Top electrode material 8 can be the same or a different electrode material than bottom electrode material 4. For example, top electrode material 8 can be composed of but not limited to Ta, TaN, Ti, TiN, Ru, RuN, RuTa, Cu, Co, W, WN, or any combination thereof. Top electrode material 8 may be deposited by ALD, CVD, PVD, PECVD, electroplating, or other suitable electrode metal deposition process. In various embodiments, top electrode material 8 is the same material as bottom electrode material 4. In an embodiment, top electrode material 8 and bottom electrode material 4 are different electrically conductive materials (e.g., different electrically conductive materials, metals, or metal alloys).

Top electrode material 8 extends from left to right in FIG. 6A with a rectangular shape. Top electrode material 4 fills the second trench in ILD 3 which is orthogonal to the first trench. The second trench is lined with dielectric material 6. Top electrode material 8 is deposited directly over dielectric material 6. In this way, a three-dimensional contact area is created between top electrode material 8, dielectric material 6, and bottom electrode material 4 in the center portion of FIG. 6A. Dielectric material 6 is sandwiched between top electrode material 8 and bottom electrode material 4 as depicted in FIG. 6A and later in FIG. 6B. Utilizing both the horizontal and vertical surfaces of top electrode material 8 and bottom electrode material 4 increases the contact area of dielectric material 6 sandwiched between the two electrode metals.

In various embodiments, top electrode material 8 forms one of a word line or a bit line in a ReRAM cross-point cell depicted later in FIGS. 7, 7A, and 7B. In other embodiments, top electrode material 8 forms a top metal plate or a top metal element in the three-dimensional MIM capacitor in FIGS. 7, 7A, and 7B.

FIG. 6B depicts a cross-sectional view 600B of section B-B of the semiconductor structure after depositing a layer of top electrode material 8, in accordance with an embodiment of the present invention. As depicted, FIG. 6B includes top electrode material 8 on dielectric material 6, a portion of a line, or a rectangular-shaped bottom electrode material 4 on the center portion of ILD 3. The portion of bottom electrode material 4 is depicted in FIG. 6B is covered on the top surface by dielectric material 6 and on the two vertical sides by dielectric material 6. Top electrode material 8 is above, surrounding, and in direct contact with dielectric material 6. FIG. 6B depicts a three-dimensional contact area between bottom electrode material 4, dielectric material 6, and top electrode material 8 in the center of FIG. 6B where bottom electrode material 4 rises above the surface of ILD 3 (e.g., in the intersection of the first trench and the second trench).

As depicted in FIGS. 6A and 6B, five sides of dielectric material 6 are sandwiched between top electrode material 8 and bottom electrode material 4 in the center of FIGS. 6A and 6B where the first and the second trench intersect. In FIG. 6A, the horizontal bottom surface of the notch and two sidewalls of the notch in the top surface of bottom electrode material 4 are directly covered by dielectric material 6. Dielectric material 6 is directly under top electrode material 8.

In FIG. 6B, the two vertical sides or sidewalls of the remaining portion of bottom electrode material 4 that rises above ILD 3 are directly covered by dielectric material 6 as is the horizontal top surface of the remaining portion of bottom electrode material 4. As depicted in FIG. 6B, three sides of bottom electrode material 4 covered by dielectric material 6.

In FIGS. 6A and 6B, the horizontal top surface of the recessed portion of bottom electrode material 4 on ILD 3 depicted in FIG. 6B is the same surface as the bottom surface of the notch depicted in bottom electrode material 4 depicted in FIG. 6A. The semiconductor structure depicted in FIGS. 6A and 6B provide five contact surfaces between dielectric material 6 and the two electrode materials. In the center portions of FIGS. 6A and 6B where the first trench intersects with the second trench, dielectric material 6 is sandwiched between top electrode material 8 and bottom electrode material 4 on five surfaces or five sides of bottom electrode material 4 and top electrode material 8 (e.g., one common horizontal surface in FIGS. 6A and 6B and two vertical sidewalls in FIG. 6A and two vertical sidewalls in FIG. 6B).

Figure 7:
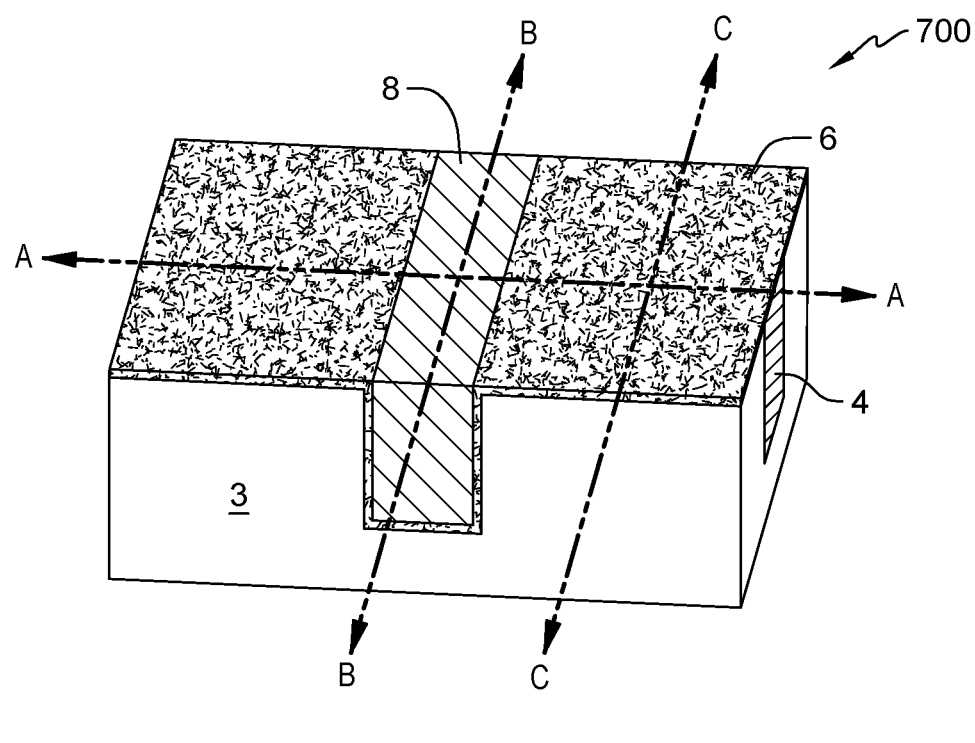
FIG. 7 depicts a three-dimensional isometric of the semiconductor structure after performing the CMP, in accordance with an embodiment of the present invention.

FIG. 7 depicts a three-dimensional isometric illustration 700 of the semiconductor structure after performing a CMP on semiconductor structures 600A and 600B, in accordance with an embodiment of the present invention. As depicted, FIG. 7 includes dielectric material 6, ILD 3, and top electrode material 8. Bottom electrode material 4 resides under a portion of dielectric material 6 and top electrode material 8 in ILD 3. Under the intersecting lines identifying cross-section A-A and cross-section B-B, bottom electrode material 4 is under dielectric material 6 (e.g., depicted on the top surface of FIG. 7). Also, identified in FIG. 7 are the locations of cross-section A-A, cross-section B-B, and cross-section C-C.

In FIG. 7, the top surface of the semiconductor structure includes dielectric material 6 with a line or portion of top electrode material 8 in the second trench running from the front of the semiconductor structure to the back of the semiconductor structure along the B-B cross-section. The front side of the three-dimensional isometric illustration 700 facing the viewer is composed of ILD 3 with a center trench that is lined on the vertical and bottom edges with dielectric material 6 and filled with top electrode material 8. The right side of the three-dimensional illustration of the semiconductor structure depicts dielectric material 6 over ILD 3 with a portion of bottom electrode material 4 under dielectric material 6 in ILD 3.

As depicted in FIG. 7, a portion of top electrode material 8 runs front to back under the line of cross-section B-B, and the portion of bottom electrode material 4 in the first trench runs from left to right directly under a portion of dielectric material 6. A portion of bottom electrode material 4 is exposed on the right side of FIG. 7.

FIG. 7A depicts a cross-sectional view 700A of section A-A of the semiconductor structure of FIG. 7 after performing a CMP, in accordance with an embodiment of the present invention. The CMP removes excess top electrode material 8 and exposes a top surface of dielectric material 6 adjacent to the exposed top surface of top electrode material 8. As depicted. FIG. 7A includes bottom electrode material 4 directly over ILD 3, dielectric material 6 directly over bottom electrode material 4 and on the sidewalls of bottom electrode material 4, and a portion of top electrode material 8 directly on a portion of dielectric material 6 in the recessed area of bottom electrode material 4. As depicted in the center of FIG. 7A, a portion of top electrode material 8 covered by dielectric material 6 protrudes into a portion of bottom electrode material 4. In the center of FIG. 7A, a notch in the top surface of bottom electrode material 4 lined with dielectric material 6 and filled with top electrode material 8. The vertical sides or sidewalls of bottom electrode material 4 and the top surface of bottom electrode material 4 create three sides of contact of dielectric material 6 where dielectric material 6 is also in direct contact with top electrode material 8.

In the center portion of FIG. 7A, where the first trench and the second trench intersect, the center portion of bottom electrode material 4, dielectric material 6, and top electrode material 8 depict one of a portion of a single stacked ReRAM point cell or a portion of a three-dimensional MIM capacitor. For example, when top electrode material 8 is a portion of a bit line and bottom electrode material 4 is a portion of a word line, then the three-dimensional structure, as depicted in FIG. 7A, is a portion of a ReRAM cross-point cell. In other embodiments, top electrode material 8 and bottom electrode material 4 are portions of two metal lines or plates that are a portion of a three-dimensional MIM capacitor.

As depicted in the center of FIG. 7A, dielectric material 6 directly on three surfaces of bottom electrode material 4 is under a portion of top electrode material 8 (e.g., dielectric material 6 surrounding top electrode material 8 is on two sidewalls above bottom electrode material 4 and a top surface of the recessed portion of bottom electrode material 4)).

FIG. 7B depicts a cross-sectional view 700B of section B-B of the semiconductor structure of FIG. 7 after performing a CMP, in accordance with an embodiment of the present invention. The CMP removes excess top electrode material 8. As depicted, FIG. 7B includes top electrode material 8 directly over dielectric material 6 where a portion of dielectric material 6 surrounds the portion of bottom electrode material 4 on ILD 3 in the center of FIG. 7B.

The portion of bottom electrode material 4 in the center of FIG. 7B extends up from the top surface of ILD 3. The portion of bottom electrode material 48 in the center of FIG. 7B corresponds to the notch in the bottom surface of top electrode material 8 depicted in FIG. 7A. The bottom surface of top electrode material 8 and the top surface of bottom electrode material 4 in the center of FIGS. 7A and 7B are the same surface.

The two sidewalls of top electrode material 8 directly contact dielectric material 6 that is surrounded by bottom electrode material 4 in FIG. 7A make two vertical sides of the three-dimensional semiconductor structure. The two sidewalls of top electrode material 8 in the center of FIG. 7B directly contacting dielectric material 6, that is directly contacting bottom electrode material 4, makes two more sides of the three-dimensional structure of FIGS. 7, 7A, and 7B, where dielectric material 6 is between bottom electrode material 4 and top electrode material 8. The bottom surface of top electrode material 8, in the center of FIG. 7B, directly contacting dielectric material 6, that is directly under top electrode material 8, makes the fifth side of the three-dimensional structure, where dielectric material 6 is sandwiched between a portion of top electrode material 8 and a portion of bottom electrode material 4.

In various embodiments, the center portion top electrode material 8, with the rectangular shape immediately adjacent to the notch (under and around the notch) in the bottom portion of top electrode material 8, resides directly on the dielectric material 6. In FIGS. 7A and 7B, the notch in the bottom portion of the center portion of the top electrode material 8 extends around dielectric material 6 covering exposed portions of bottom electrode material 4 around and above the notch in the top portion of the center of the bottom electrode material 4 (e.g., the raised portion of bottom electrode material 4 in FIG. 7B). In other words, the notch in the bottom portion of top electrode material 8 and the notch in the top portion of bottom electrode material 4 fit together around dielectric material 6 like two pieces of a puzzle in the center of FIGS. 7A and 7B.

In the center of FIGS. 7, 7A, and 7B where the two interlocking notches are formed by the intersection of the first trench and the second trench previously depicted in FIG. 4, five sides of dielectric material 6 is between portions of top electrode material 8 and bottom electrode material 4. The three-dimensional semiconductor structure depicted in FIGS. 7, 7A, and 7B can be either a three-dimensional ReRAM cross-point cell or a three-dimensional MIM capacitor.

The three-dimension semiconductor structure of FIGS. 7, 7A, and 7B provides a large contact area between dielectric material 6 and the two electrode materials in the center overlapping notched portions of the two electrode materials. Unlike conventional, two-dimensional ReRAM devices or conventional two-dimensional MIM capacitors with one side of the contact area between the dielectric material and the two electrodes (e.g., metal plates), the three-dimensional structure of FIGS. 7, 7A, and 7B provide the four additional vertical sides or sidewalls of the contact area of dielectric material 6 with top electrode material 8 and bottom electrode material 4 (i.e., a total of five sides of contact area), electrode material 8 and the rectangular-shaped line of bottom electrode material 4.

Bottom electrode material 4 in the center of FIG. 7B is the remaining portion of bottom electrode material 4 after recessing bottom electrode material 4 as depicted in FIG. 4. Three sides of bottom electrode material 4 in FIG. 7B are directly abutting dielectric material 6 where dielectric material 6 is directly under a portion of top electrode material 8 (e.g., the center portion of dielectric material 6 is sandwiched between top electrode material 8 and bottom electrode material 4).

The horizontal top surface of dielectric material 6 on the top surface of bottom electrode material 4 is the same horizontal surface as the horizontal bottom surface dielectric material 6 under the bottom portion of top electrode material 8 in FIG. 7A. In this way, the semiconductor structure provides five sides or five contact surfaces between dielectric material 6 with top electrode material 8 and bottom electrode material 4. The five sides include two vertical sidewalls in the center of FIG. 7A, two vertical sidewalls in the center of FIG. 7B, and the common horizontal surface in the center of both FIG. 7A and FIG. 7B. In these five sides, dielectric material 6 is between top electrode material 8 and bottom electrode material 4. The semiconductor structures of FIGS. 7A and 7B provide a large surface area of dielectric material 6 where dielectric material 6 is sandwiched between portions of bottom electrode material 4 and top electrode material 8.

When top electrode material 8 is a portion of a word line and bottom electrode material 4 is a portion of a bit line, or alternatively, when top electrode material 8 is a portion of a bit line and bottom electrode material 4 is a portion of a word line then, in various embodiments, the three-dimension semiconductor structure depicted in FIGS. 7, 7A and 7B is a ReRAM cross-point cell. The ReRAM cross-point cell has five side or surface areas for switching the ReRAM cross-point cell where dielectric material 6 surrounds the intersecting notches in the bottom of top electrode material 8 and the top of bottom electrode material 4. The ReRAM cross-point cell depicted in FIGS. 7, 7A, and 7B provides more contact area of dielectric material 6 between the top and bottom electrodes (i.e., top electrode material 8 and bottom electrode material 4) than a conventional two-dimensional ReRAM device. The large contact area of the switching layer (i.e., dielectric material 6) with the two electrodes of the ReRAM cross-point cell of FIGS. 7, 7A, and 7B reduces the forming voltage of the ReRAM cross-point cell compared to a conventional two-dimensional ReRAM cell or device. In other words, the ReRAM cross-point cell of the present invention has a low forming voltage.

Alternatively, a smaller footprint can be provided with the three-dimensional ReRAM structure of the ReRAM cross-point cell of FIGS. 7, 7A, and 7B than the footprint of a conventional two-dimensional ReRAM cell with the same forming voltage. With the same forming voltage, the ReRAM cross-point cell of FIGS. 7, 7A, and 7B can provide a tighter pitch between adjacent single stacked ReRAM point cells in a crossbar array compared to conventional two-dimensional ReRAM devices in a conventional ReRAM crossbar array.

In another embodiment, the center portions of top electrode material 8 and bottom electrode material 4, which are over and under dielectric material 6 in FIGS. 7A and 7B, are a top metal (top electrode material 8) and a bottom metal (bottom electrode material 4) sandwiching an insulator (dielectric material 6) to form a three-dimensional MIM capacitor. The three-dimensional metal-insulator-metal structure composed of top electrode material 8, dielectric material 6, and bottom electrode material 4 depicted in the center portions of FIGS. 7, 7A, and 7B forms a three-dimensional MIM capacitor. As previously discussed, the three-dimensional MIM capacitor of FIGS. 7, 7A, and 7B provides a large contact area between the metal electrodes (e.g., top electrode material 8 and bottom electrode material 4) and the capacitor insulator (e.g., dielectric material 6). The three-dimensional MIM capacitor of embodiments of the present invention provides more capacitance for the same footprint or horizontal area than a conventional two-dimensional MIM capacitor. The footprint of the three-dimensional MIM capacitor is essentially the horizontal area of the notch in the bottom surface of top electrode material 8 (e.g., depicted in FIG. 7A) or the raised portion of bottom electrode material 4 (e.g., depicted in FIG. 7B). The three-dimensional MIM capacitor provides a high capacitance. Alternatively, the pitch between adjacent three-dimensional MIM capacitors can be reduced while maintaining the same MIM capacitor capacitance compared to a conventional two-dimensional MIM capacitor providing the same capacitance.

As known to one skilled in the art, several single ReRAM cross-point cells can form a ReRAM crossbar array when bottom electrode material 4 (e.g., word or bit line) and top electrode material 8 (e.g., word line or bit line) can be extended to other single ReRAM cross-point cells (not depicted). In other embodiments, several of the three-dimensional MIM capacitors can also from a crossbar array of three-dimensional MIM capacitors.

FIG. 7C depicts a cross-sectional view of section C-C of the semiconductor structure of FIG. 7 after performing a CMP, in accordance with an embodiment of the present invention. The CMP removes top electrode material 8 from cross-section C-C. As depicted, FIG. 7C includes ILD 3 with a portion of bottom electrode material 4 in the trench (running along the line of cross-section A-A) and dielectric material 6 over the top surface of ILD 3 and bottom electrode material 4.

Figure 8A:
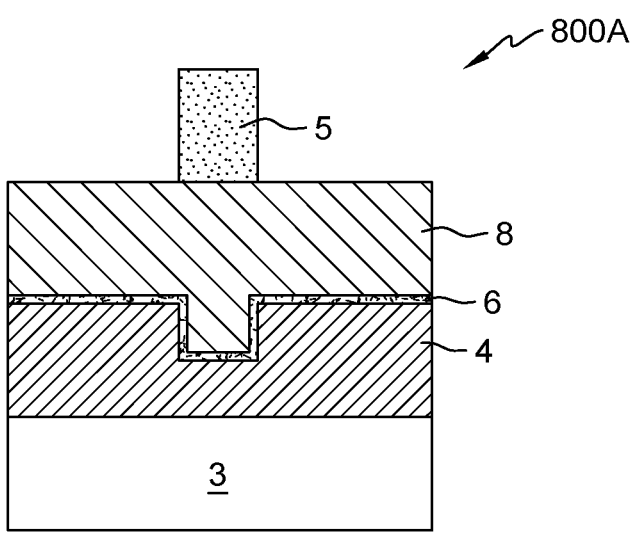
FIG. 8A depicts a cross-sectional view of section A-A of the semiconductor structure after depositing a second top electrode material on the semiconductor structure of FIG. 6A, in accordance with an embodiment of the present invention.

FIG. 8A depicts a cross-sectional view 800A of section A-A of the semiconductor structure of FIG. 6A after depositing and patterning another layer of OPL 5 on top electrode material 8, in accordance with an embodiment of the present invention. As depicted, FIG. 8A includes the elements of the semiconductor structure of FIG. 6A with OPL 5 on the center of top electrode material 8. A portion of OPL 5, after patterning, remains in the center of top electrode material 8.

Figure 8B:
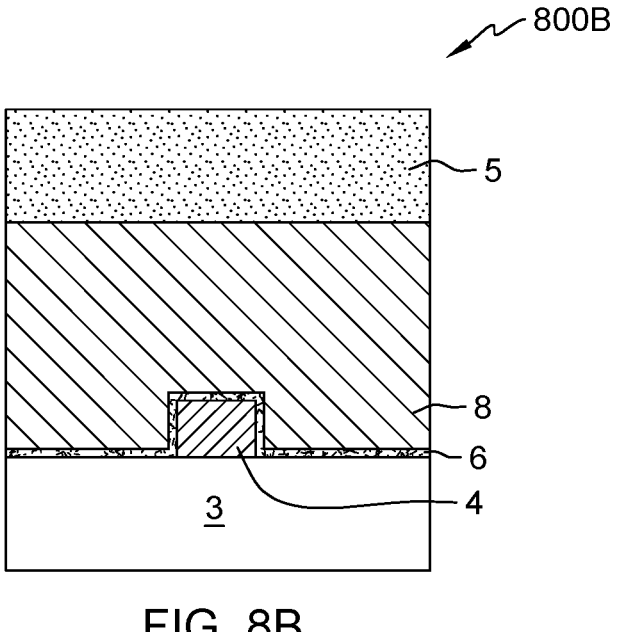
FIG. 8B depicts a cross-sectional view of section B-B of the semiconductor structure after depositing the second top electrode material on the semiconductor structure of FIG. 6B, in accordance with an embodiment of the present invention.

FIG. 8B depicts a cross-sectional view 800B of section B-B of the semiconductor structure of FIG. 6B after depositing and patterning OPL 5 on top electrode material 8, in accordance with an embodiment of the present invention. As depicted, FIG. 8B includes the elements of FIG. 6B with OPL 5 on top electrode material 8.

Figure 9A:
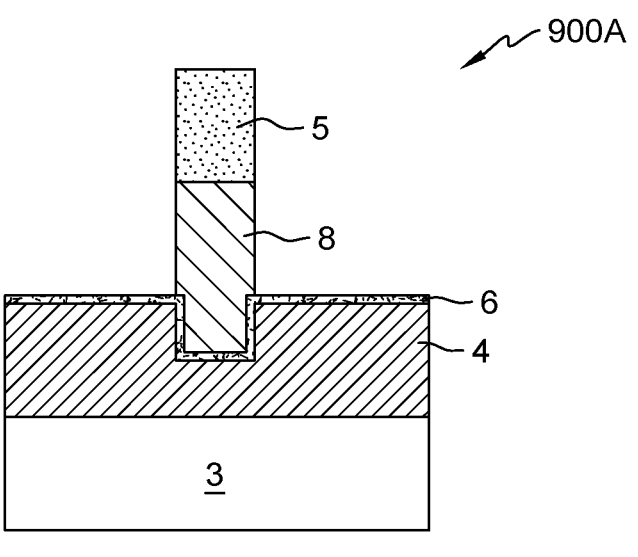
FIG. 9A depicts a cross-sectional view of section A-A of the semiconductor structure after removing exposed portions of the top electrode material, in accordance with an embodiment of the present invention.

FIG. 9A depicts a cross-sectional view 900A of section A-A of the semiconductor structure after removing exposed portions of top electrode material 8, in accordance with an embodiment of the present invention. As depicted, FIG. 9A includes the elements of FIG. 8A without the exposed portions of top electrode material 8 on dielectric material 6. An etching process, such as a RIE, selectively removes the exposed portions of top electrode material 8. After etching, the portions of dielectric material 6 that are not below OPL 5 are exposed.

Figure 9B:
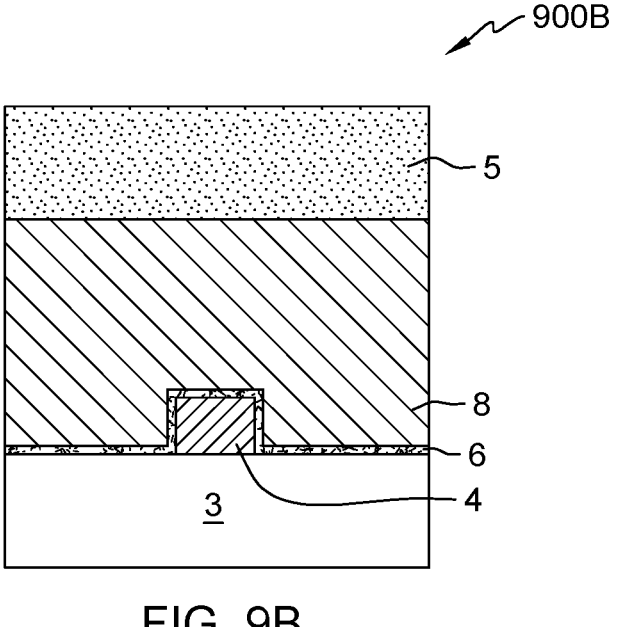
FIG. 9B depicts a cross-sectional view of section B-B of the semiconductor structure after removing exposed portions of the top electrode material, in accordance with an embodiment of the present invention.

FIG. 9B depicts a cross-sectional view 900B of section B-B of the semiconductor structure after removing exposed portions of top electrode material 8, in accordance with an embodiment of the present invention. As depicted, FIG. 9B includes the elements of FIG. 8B. FIG. 9B appears essentially the same as FIG. 8B.

Figure 10A:
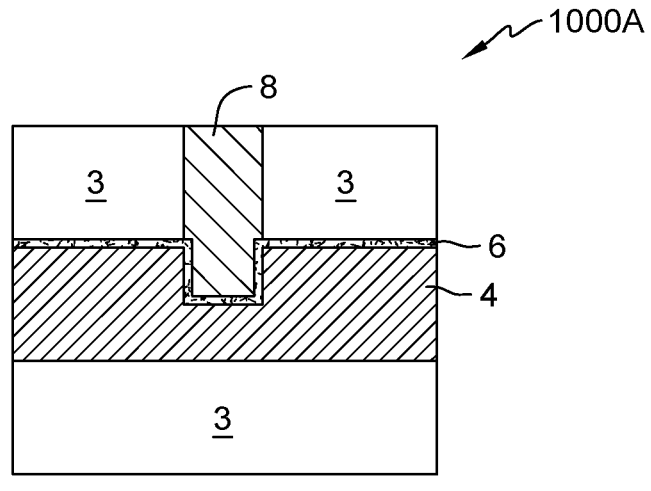
FIG. 10A depicts a cross-sectional view of section A-A of the semiconductor structure after depositing another layer of ILD and performing a CMP, in accordance with an embodiment of the present invention.

FIG. 10A depicts a cross-sectional view 1000A of section A-A of the semiconductor structure after removing OPL 5, depositing another layer of ILD 3, and performing a CMP, in accordance with an embodiment of the present invention. The remaining portion of OPL 5 is removed (e.g., by plasma ash, etching). The second layer of ILD 3 can be deposited using known deposition processes (e.g., CVD, PVD, ALD, etc.). The second layer of ILD 3 covers the exposed portions of dielectric material 6 and surrounds the top portion of top electrode material 8. The second layer of ILD 3 can be composed of any interlayer dielectric material. In various embodiments, the second layer of ILD 3 is the same interlayer dielectric material as the first layer of ILD 3 (e.g., $SiO_2$). In one embodiment, the second layer of ILD 3 is a different interlayer dielectric material.

The CMP may stop on the top surface of top electrode material 8. As depicted, FIG. 10A includes a portion of top electrode material 8, portions of the second ILD 3, dielectric material 6, bottom electrode material 4, and the bottom layer of ILD 3.

Figure 10B:
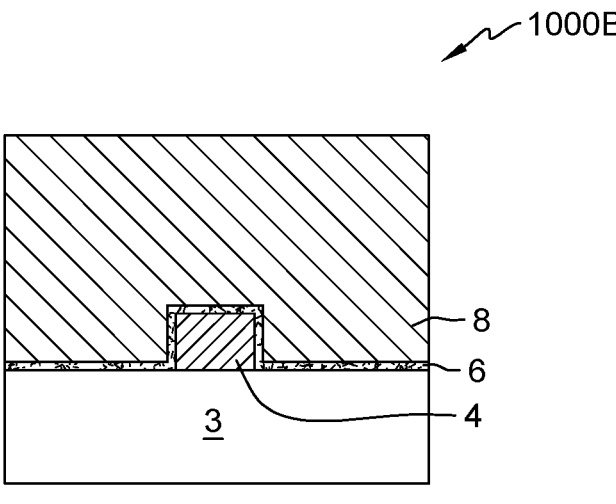
FIG. 10B depicts a cross-sectional view of section B-B of the semiconductor structure after depositing the ILD and performing the CMP, in accordance with an embodiment of the present invention.

FIG. 10B depicts a cross-sectional view 1000B of section B-B of the semiconductor structure after depositing the second layer of ILD 3 and performing the CMP, in accordance with an embodiment of the present invention. As depicted, FIG. 10B includes the elements of FIG. 9B without OPL 5. Top electrode material 8 is directly on dielectric material 6, bottom electrode material 4 is on the first layer of ILD 3, and dielectric material 6 is over bottom electrode material 4 and under top electrode material 8 as depicted in FIG. 10B.

Figure 11A:
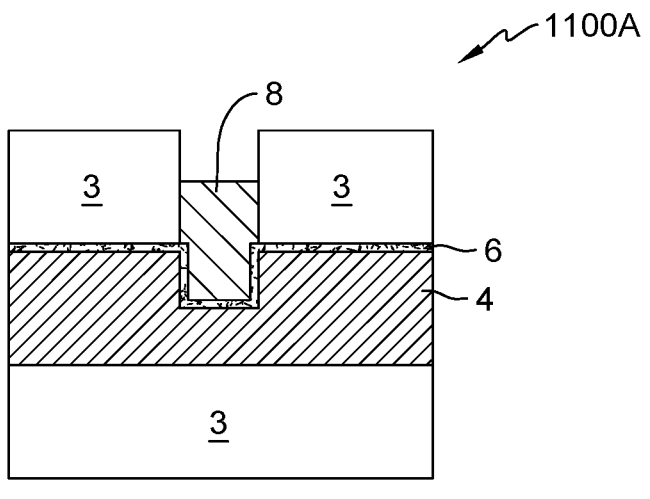
FIG. 11A depicts a cross-sectional view of section A-A of a semiconductor structure after patterning another layer of OPL on the top electrode and removing exposed portions of the top electrode, in accordance with a second embodiment of the present invention.

FIG. 11A depicts a cross-sectional view 1100A of section A-A of the semiconductor structure after removing exposed portions of top electrode material 8, in accordance with a second embodiment of the present invention. As depicted, FIG. 11A includes a recessed portion of top electrode material 8 between two portions of the second layer of ILD 3. The recessed portion of top electrode material 8 resides in the center portion of FIG. 11A.

Figure 11B:
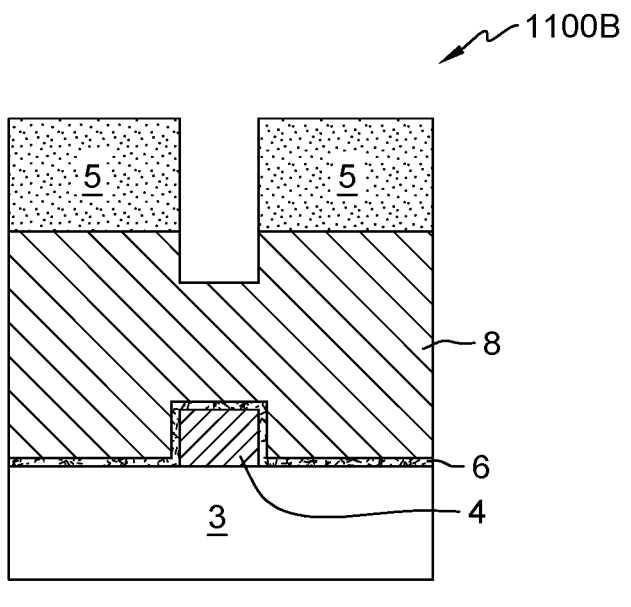
FIG. 11B depicts a cross-sectional view of section B-B of a semiconductor structure after patterning another layer of OPL and removing exposed portions of the top electrode, in accordance with a second embodiment of the present invention.

FIG. 11B depicts a cross-sectional view 1100B of section B-B of a semiconductor structure after patterning another layer of OPL 5 and removing exposed portions of top electrode material 8, in accordance with an embodiment of the present invention. As depicted, FIG. 11B includes two portions of OPL 5 over portions of the top surface of top electrode material 8, dielectric material 6, bottom electrode material 4, and ILD 3. A portion of top electrode material 8 not covered by OPL 5 can be partially removed. As depicted in FIG. 11B, a notch in the top center portion of the top surface of top electrode material 8 can be created.

The removed center portion of top electrode material 8 is not covered by OPL 5. The removed portion of top electrode material 8 is above the portion of bottom electrode material 4. The portion of top electrode material 8 removed is in the center of FIG. 11B directly above the intersection of the first trench and the second trench depicted in FIG. 4 where bottom electrode material 4 rises above the bottom ILD 3.

Figure 12A:
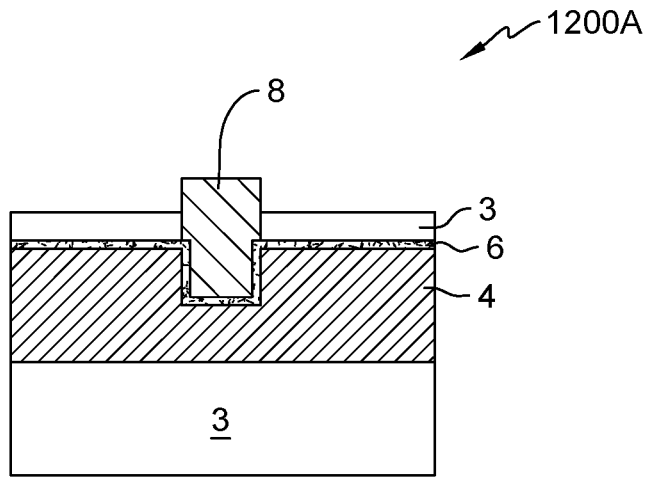
FIG. 12A depicts a cross-sectional view of cross-section A-A of a semiconductor structure after recessing exposed portions of the exposed top ILD, in accordance with a second embodiment of the present invention.

FIG. 12A depicts a cross-sectional view 1200A of section A-A of a semiconductor structure after recessing exposed portions of the second layer of ILD 3, in accordance with an embodiment of the present invention. As depicted, FIG. 12A includes the elements of FIG. 11A without a top portion of the second layer of ILD 3. The second layer of ILD 3 is recessed such that the top surface of the second layer of ILD 3 is below the top surface of top electrode material 8.

Figure 12B:
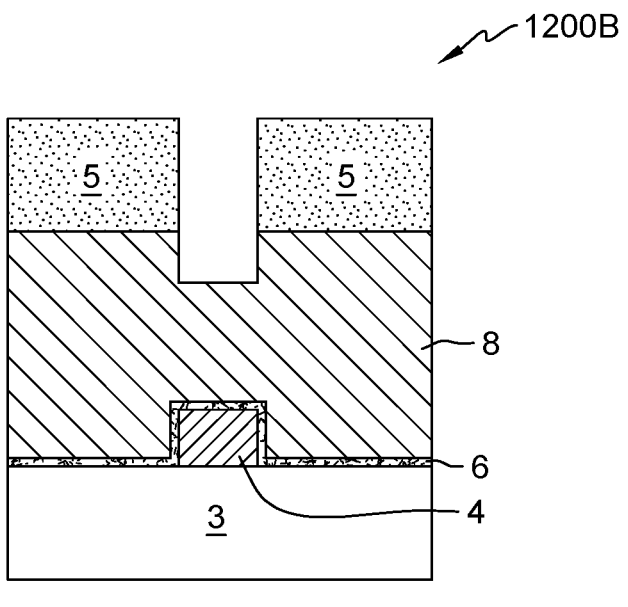
FIG. 12B depicts a cross-sectional view of cross-section B-B of a semiconductor structure after recessing exposed portions of the exposed top ILD, in accordance with a second embodiment of the present invention.

FIG. 12B depicts a cross-sectional view 1200B of section B-B of a semiconductor structure after recessing exposed portions of ILD (not depicted in FIG. 12B), in accordance with an embodiment of the present invention. As depicted, FIG. 12B includes the elements of FIG. 11B (e.g., FIG. 12B is essentially the same as FIG. 11B).

Figure 13A:
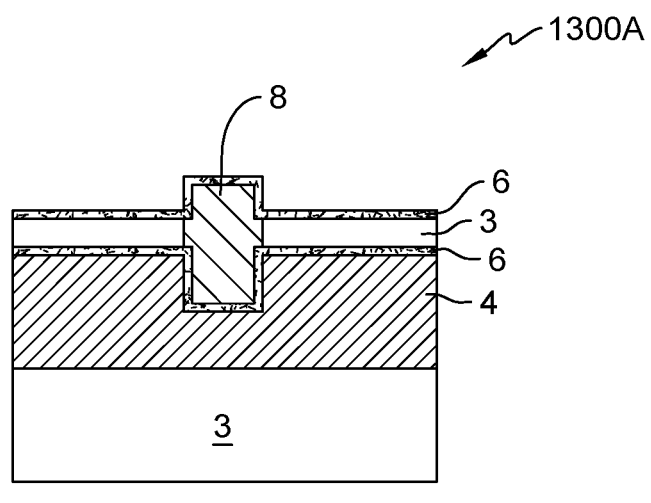
FIG. 13A depicts a cross-sectional view of section A-A of the semiconductor structure after removing OPL and depositing dielectric material, in accordance with the second embodiment of the present invention.

FIG. 13A depicts a cross-sectional view 1300A of section A-A of the semiconductor structure depositing another layer of dielectric material 6, in accordance with an embodiment of the present invention. As depicted, FIG. 13A includes the elements of FIG. 12A with a second layer of dielectric material 6 directly over an upper portion of top electrode material 8 and directly on the top surface of the second layer of ILD 3 surrounding a middle portion of top electrode material 8. Top electrode material 8 resides in a center portion of FIG. 13B with a top portion of top electrode material 8 covered by the second layer of dielectric material 6 and a bottom portion of top electrode material 8 in bottom electrode material 4 surrounded by the first layer of dielectric material 6.

The second layer of dielectric material 6 can also include a layer of a selector material (not specifically depicted in FIG. 13B) which may be deposited on dielectric material 6. In some embodiments, the second layer of dielectric material 6 can have the same composition as the first layer of dielectric material 6.

As depicted in the center of FIG. 13A, two vertical sides above the second layer of ILD 3 and a horizontal top surface of top electrode material 8 are directly contacting the second layer of dielectric material 6. The three sides of the second layer of top electrode material 8 that are covered by a portion of the second layer of dielectric material 6 are directly above the intersection of the lines indicating cross-section A-A and cross-section B-B in FIG. 7.

Figure 13B:
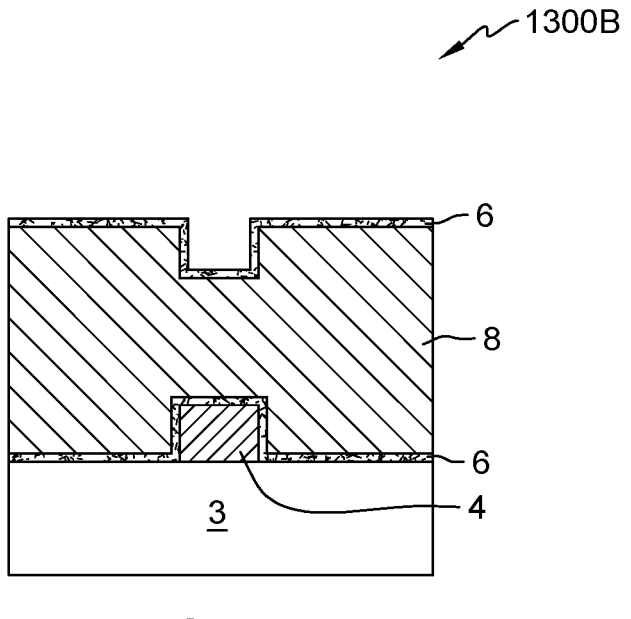
FIG. 13B depicts a cross-sectional view of section B-B of the semiconductor structure after removing OPL and depositing dielectric material, in accordance with a second embodiment of the present invention.

FIG. 13B depicts a cross-sectional view 1300B of section B-B of the semiconductor structure after removing OPL and depositing a second layer of dielectric material 6 over the top surface of the semiconductor structure, in accordance with an embodiment of the present invention. As depicted, FIG. 13B includes the elements of FIG. 12B without OPL 5 and with a second layer of dielectric material 6 deposited on top electrode material 8. The second layer of dielectric material 6 covers the top surface of top electrode material 8.

Figure 14A:
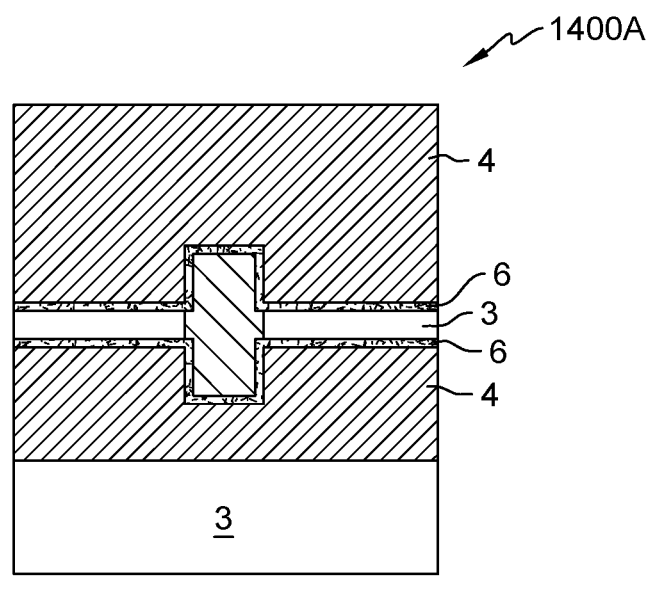
FIG. 14A depicts a cross-sectional view of section A-A of the semiconductor structure after depositing a second layer of the bottom electrode material over the top surface of the semiconductor structure, in accordance with the second embodiment of the present invention.

FIG. 14A depicts a cross-sectional view 1400A of section A-A of the semiconductor structure after depositing a layer of a second bottom electrode material 4, in accordance with an embodiment of the present invention. As depicted, FIG. 14A includes the elements of FIG. 13A and a second layer of bottom electrode material 4 on the second layer of dielectric material 6.

After depositing the second layer of bottom electrode material 4, a portion of top electrode material 8 covered by a portion of the second layer of dielectric material 6 protrudes up into the second layer of bottom electrode material 4 in the center of FIG. 14A. In some embodiments, both layers of dielectric material 6 are a high-k dielectric material. In various embodiments, the second layer of dielectric material 6 may have an associated selector material.

Figure 14B:
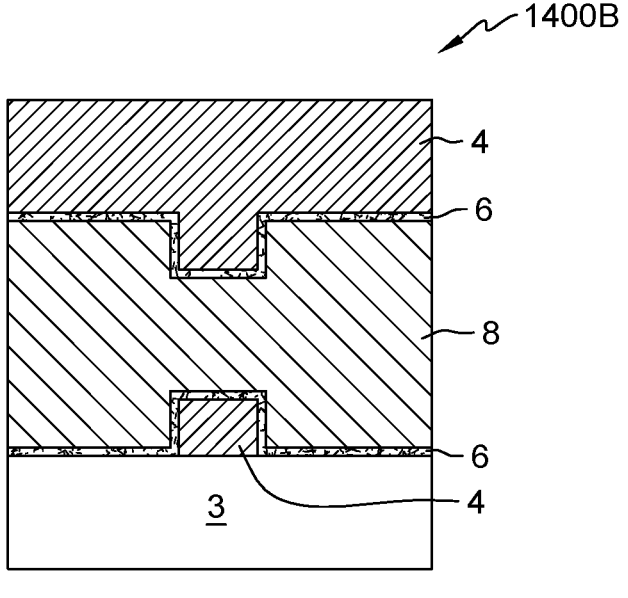
FIG. 14B depicts a cross-sectional view of section B-B of the semiconductor structure after depositing a second layer of the bottom electrode material over the top surface of the semiconductor structure, in accordance with the second embodiment of the present invention.

FIG. 14B depicts a cross-sectional view 1400B of section B-B of the semiconductor structure after depositing the second layer of bottom electrode material 4, in accordance with an embodiment of the present invention. As depicted, FIG. 14B includes the elements of FIG. 13B with the second layer of bottom electrode material 4 on the second layer of dielectric material 6.

In FIG. 14B, the bottom ILD 3 is directly under a portion of the bottom or first layer of dielectric material 6. The remaining portion of the first layer of bottom electrode material 4 in the center of ILD 3 is directly under a portion of the first layer of dielectric material 6. The first layer of dielectric material 6 is directly under top electrode material 8. The second layer of dielectric material 6 is directly over top electrode material 8 and the second layer of ILD 3. The second layer of bottom electrode material 4 is directly on the second layer of dielectric material 6.

In the center of FIG. 14B, the upward extending portion of the first layer of bottom electrode material 4 on the bottom ILD 3 and the downward extending portion of the second layer of bottom electrode material 4 above a center portion of the second layer of dielectric material 6 are directly above and below each other (e.g., vertically aligned).

Figure 15:
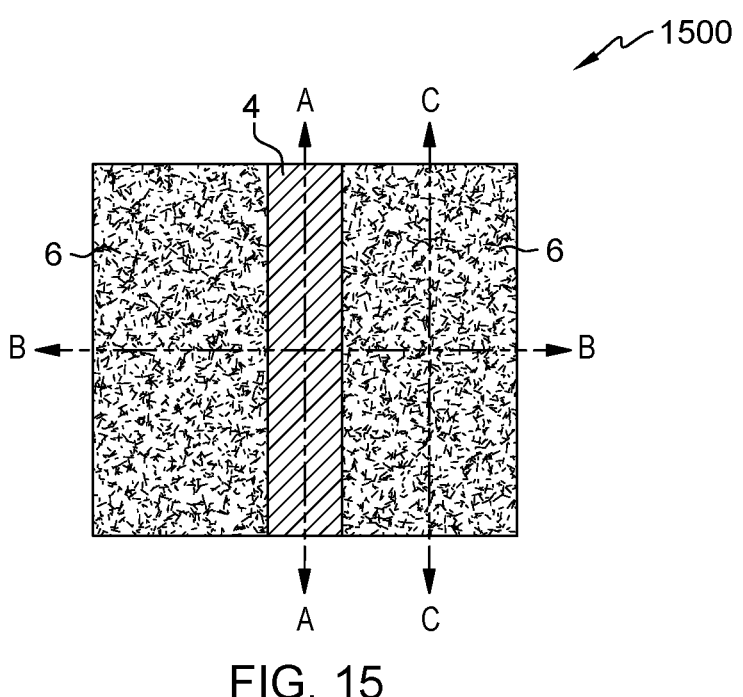
FIG. 15 depicts a top view of the semiconductor structure after performing a CMP, in accordance with an embodiment of the present invention.

FIG. 15 depicts top view 1500 of the semiconductor structure after performing a CMP, in accordance with an embodiment of the present invention. As depicted, FIG. 15 includes dielectric material 6 and a remaining portion of the second layer of bottom electrode material 4. The CMP removes excess portions of the second layer of bottom electrode material 4 from the top surfaces of the second layer of dielectric material 6. A line or rectangular-shaped element of the remaining portion of the second layer of bottom electrode material 4 extends from the top center of FIG. 15 to the bottom center of FIG. 15. FIG. 15 also illustrates the locations of cross-section A-A, cross-section B-B, and cross-section C-C.

Figure 15A:
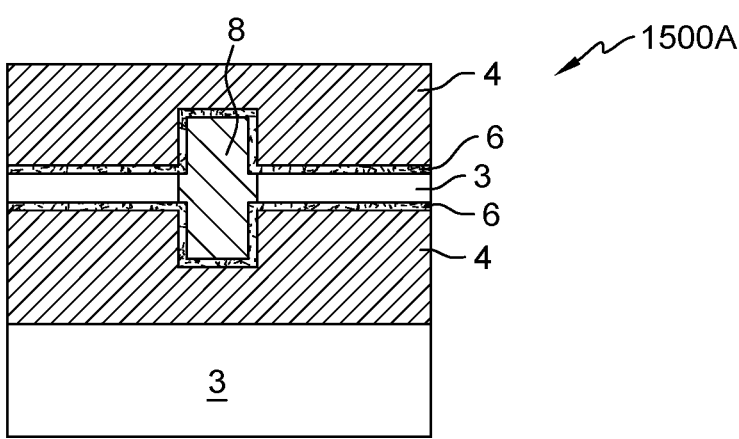
FIG. 15A depicts a cross-sectional view of section A-A of the semiconductor structure after performing a CMP, in accordance with the second embodiment of the present invention.

FIG. 15A depicts cross-sectional view 1500A of section A-A of the semiconductor structure after performing the CMP, in accordance with an embodiment of the present invention. As depicted, FIG. 15A includes the bottom layer of ILD 3 under the bottom or first layer of bottom electrode material 4, a first layer of dielectric material 6, top electrode material 8, a second layer of ILD 3 between outside portions of the first and the second layer of dielectric material 6 and surrounding middle portion of top electrode material 8, and a second or top layer of bottom electrode material 4 directly over the second layer of dielectric material 6. The remaining portions of the first layer and the second layer of bottom electrode material 4 are parallel (e.g., running from left to right) and orthogonal to top electrode material 8 (e.g., going into and out of the paper). The CMP removes the top portion of the second layer of bottom electrode material 4.

In various embodiments, the first layer of bottom electrode material 4 is a word line, top electrode material 8 is a bit line, and the second layer of bottom electrode material 4 is also a word line. Alternatively, top electrode material 8 is a word line and the two layers of bottom electrode material 4 are bit lines. In these embodiments, the semiconductor structure of FIG. 15A is a portion of a double-stacked ReRAM cross-point cell.

Figure 15B:
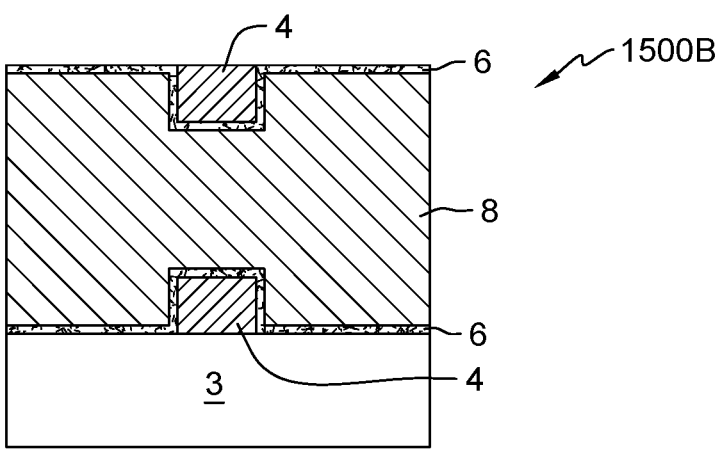
FIG. 15B depicts a cross-sectional view of section B-B of the semiconductor structure after performing the CMP, in accordance with the second embodiment of the present invention.

The bottom center portion of FIG. 15A and FIG. 15B is the bottom ReRAM cross-point cell has five sides of the semiconductor structure for the bottom ReRAM cross-point cell previously discussed in detail with respect to FIGS. 7, 7A, and 7B.

The addition of the second layers of dielectric material 6 and bottom electrode material 4 combined with top electrode material 8 forms a second or top ReRAM cross-point cell in the double-stacked ReRAM cross-point cell. The second ReRAM cross-point is vertically aligned over the first ReRAM cross-point cell (e.g., the first ReRAM cross-point cell is also depicted in FIGS. 7, 7A, and 7B). In FIG. 15A, the two sidewalls of top electrode material 8 and a top horizontal surface of top electrode material 8 are directly contacting the second layer of dielectric material 6 and are below the second layer of bottom electrode material 4 on the second layer of dielectric material 6.

FIG. 15B depicts a cross-sectional view 1500B of section B-B of the semiconductor structure after performing the CMP, in accordance with an embodiment of the present invention. As depicted, FIG. 15B includes the elements of FIG. 14B without the overburden of the second bottom electrode material 4. After the CMP, the excess portions of the second layer of bottom electrode material 4 are removed exposing the top surface of the second layer of dielectric material 6 and the remaining portion of the second layer of bottom electrode material 4. The remaining portions of the first layer and the second layer of bottom electrode material 4 are vertically aligned and orthogonal to top electrode material 8.

The semiconductor structures depicted in FIGS. 15A and 15B provide a large surface area of dielectric material 6 where dielectric material 6 is between portions of top electrode material 8 and either portions of the first layer of bottom electrode material 4 or the second layer of bottom electrode material 4.

In various embodiments, when top electrode material 8 is a word line or bit line and the two layers of bottom electrode material 4 are bit lines or word lines, respectively, the double-stacked semiconductor structure depicted in FIGS.

15A and 15B is a double-stacked ReRAM cross-point cell. For example, the first and the second layer of bottom electrode material 4 are word lines and top electrode material 8 is a bit line.

As previously discussed, the intersection of the first layer of bottom electrode material 4 and top electrode material 8 in the center of FIGS. 15, 15A, and 15B provides five sides or five contact areas of the dielectric material with the two bottom electrodes where the first layer of dielectric material 6 is sandwiched between a bottom portion of top electrode material 8 and a portion of the first layer of bottom electrode material 4. The first bottom electrode material 4 covered by the first layer of dielectric material 6 that is under a portion of top electrode material 8 in the center of FIGS. 15, 15A, and 15B is the first or lower ReRAM cross-point cell in the double-stacked ReRAM cross-point cell.

Additionally, the upper center portions of FIGS. 15, 15A, and 15B depict the intersection of top electrode material 8 with the second layer of bottom electrode material 4 where five sides of the second layer of dielectric material 6 is between the top center portion of top electrode material 8 and the second or top layer of bottom electrode material 4. The center portions of the top surface of top electrode material 8, the second layer of dielectric material 6, and the second layer of bottom electrode material 4 form a second or top ReRAM cross-point cell of the double-stacked ReRAM cross-point cell. The second ReRAM cross-point cell is directly above and vertically aligned with the first or lower ReRAM cross-point cell. The second ReRAM cross-point cell provides a semiconductor structure with five more sides of dielectric material 6 sandwiched between top electrode material 8 and the second layer of bottom electrode material 4.

As depicted in FIGS. 15A and 15B, the double-stacked semiconductor structure provides ten sides of the semiconductor structure where a dielectric material (i.e., the first layer of dielectric material 6 and the second layer of dielectric material 6) is between a portion of top electrode material 8 and either a portion of the first layer of bottom electrode material 4 or the second bottom electrode material 4 (e.g., four vertical sidewalls and a common horizontal surface or side in the bottom ReRAM cross-point cell and four vertical sidewalls and a common horizontal surface or side in the top ReRAM cross-point cell).

Increasing dielectric material 6 contact area with the three electrodes in the double-stacked ReRAM cross-point cell of FIGS. 15, 15A, and 15B provides a lower forming voltage for the double-stacked ReRAM cross-point cell compared to the conventional ReRAM devices or the ReRAM cross-point cell depicted in FIGS. 7, 7A, and 7B with the same device footprint. The ten sides of the double-stacked ReRAM cross-point cell where the dielectric material 6 is between two electrodes includes the first layer of dielectric material 6 between the first layer of bottom electrode material 4 and top electrode material 8, and the second layer of dielectric material 6 between top electrode material 8 and the second layer of bottom electrode material 4. The ten sides of contact area provide a large contact area of the electrodes and the dielectric material and reduces the forming voltage of the double-stacked ReRAM cross-point cell compared to a conventional ReRAM cell or the ReRAM cross-point cell of FIGS. 7, 7A, and 7B. The double-stacked ReRAM cross-point cell with ten sides of contact area of the dielectric material with the electrodes has a low forming voltage. The double-stacked ReRAM cross-point cell can provide twice the contact surface area of the ReRAM cross-point cell of FIGS. 7A and 7B and a lower forming voltage.

Alternatively, the double-stacked ReRAM cross-point cell with the same forming voltage as a conventional two-dimensional ReRAM cell would have a smaller footprint. Adjacent double-stacked ReRAM cross-point cells with the same forming voltage can have a tighter pitch between adjacent double-stacked ReRAM cross-point cells than conventional two-dimensional ReRAM cells or the single ReRAM cross-point cell of FIG. 7.

As previously discussed, in other embodiments, top electrode material 8, the first layer of bottom electrode material 4, and the second layer of bottom electrode material 4 are not word lines or bit lines. In these embodiments, the semiconductor structure depicted in FIGS. 15A and 15B is a double-stacked three-dimensional MIM capacitor. As depicted in FIGS. 15A and 15B as discussed above, the double-stacked MIM capacitor provides ten sides of the semiconductor structure where portions of a dielectric material (i.e., the first layer of dielectric material 6 and the second layer of dielectric material 6) can be between a portion of top electrode material 8 and either a portion of the first layer of bottom electrode material 4 or the second bottom electrode material 4 (e.g., four vertical sidewalls and a common horizontal surface or side in the bottom three-dimensional MIM capacitor and four vertical sidewalls and a common horizontal surface or side in the top three-dimensional MIM capacitor). The semiconductor structure depicted in the center of FIGS. 15A and 15B provides a large contact area of dielectric material 6 with the two metal electrode materials. As depicted, dielectric material 6 is sandwiched between portions of top electrode material 8 and either top portions of the first layer of bottom electrode material 4 or bottom portions of the second layer of bottom electrode material 4.

The large surface area of dielectric material 6 (i.e., portions of the two layers of dielectric material 6) between top electrode material 8 and a portion of either the first layer of bottom electrode material 4 or the second layer of bottom electrode material 4 generates a large capacitance in the double stacked three-dimensional MIM capacitor. The double-stacked three-dimensional MIM capacitor provides more capacitance than the three-dimensional MIM capacitor of FIGS. 7, 7A, and 7B or a conventional two-dimensional MIM capacitor. The double-stacked three-dimensional MIM capacitor provides a high capacitance or a large amount of capacitance.

A double-stacked three-dimensional MIM capacitor providing the same capacitance as a conventional two-dimensional or the three-dimensional MIM capacitor of FIGS. 7, 7A, and 7B has a smaller footprint. In this way, for a set capacitance level (i.e., the same capacitance), the double-stacked three MIM capacitor has a smaller footprint than traditional two-dimensional MIM capacitors or the single three-dimensional MIM capacitor depicted in FIG. 7. The double-stacked three-dimensional MIM capacitors can increase capacitance, decrease the space or the pitch between adjacent double-stacked three-dimensional MIM capacitors, or in some cases, can do a combination of increasing the capacitance and decreasing the footprint of the three-dimensional MIM capacitors (i.e., decreasing the pitch between adjacent double-stacked three-dimensional MIM capacitors) to some degree.

In various embodiments, several double-stacked three-dimensional MIM capacitors can be connected along top electrode material 8 and the two layers of bottom electrode material 4 forming a double-stacked three-dimensional MIM capacitor crossbar array.

Figure 15C:
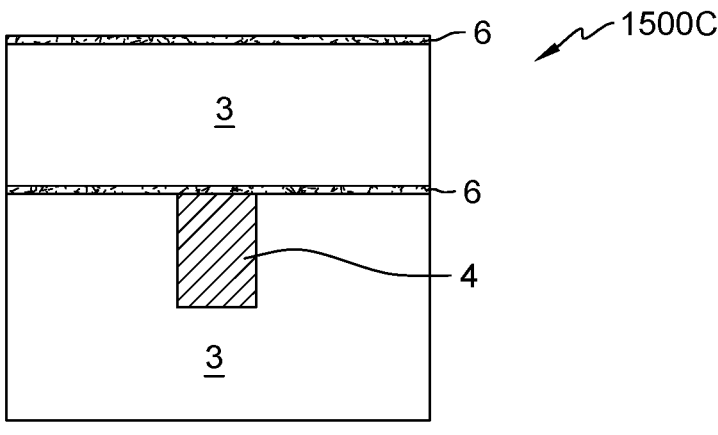
FIG. 15C depicts a cross-sectional view of section C-C of the semiconductor structure after performing the CMP, in accordance with an embodiment of the present invention.

FIG. 15C depicts a cross-sectional view 1500C of section C-C of the semiconductor structure after performing the CMP, in accordance with an embodiment of the present invention. As depicted, FIG. 15C includes a top or second layer of dielectric material 6 over a top or second layer of ILD 3, a first or bottom layer of dielectric material 6 under the second layer of ILD 3, and a portion of the bottom layer of bottom electrode material 4 in the first ILD 3. The first layer of ILD 3 and the layer of bottom electrode material 4 are under the first layer of dielectric material 6. As depicted in FIG. 15, cross-section C-C is parallel to cross-section A-A.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A semiconductor structure comprising:
   a bottom electrode material in an interlayer dielectric material, wherein a first notch is in a top portion of the bottom electrode material in an intersection of the bottom electrode material with a top electrode material;
   a dielectric material directly contacting the bottom electrode material and a top surface of the interlayer dielectric material, wherein in the intersection of the bottom electrode material with the top electrode material, the dielectric material is between five sides of the bottom electrode material and a top electrode material; and
   the top electrode material directly on the dielectric material, wherein a second notch in a bottom portion of the top electrode material is in the intersection of the bottom electrode material with the top electrode material.

2. The semiconductor structure of claim 1, wherein the dielectric material is a high-k dielectric material.

3. The semiconductor structure of claim 1, wherein the dielectric material has a contact area with four sidewalls of the bottom electrode material and the top electrode material and with a horizontal surface of the bottom electrode material and the top electrode material in the intersection.

4. The semiconductor structure of claim 1, wherein the dielectric material between the five sides of the bottom electrode material and the top electrode material further comprises the dielectric material contacting two sidewalls of the top electrode material above a horizontal surface of the second notch, the horizontal surface of the second notch, and two sidewalls of the top electrode material below the horizontal surface of the second notch.

5. The semiconductor structure of claim 1, wherein:
   the top electrode material is a word line;

the bottom electrode material is a bit line; and the semiconductor structure is a resistive random-access memory (ReRAM) cross-point cell.

6. The semiconductor structure of claim 5, wherein the ReRAM cross-point cell has a contact area of the dielectric material with a horizontal surface of the bottom electrode material and the top electrode material and with four vertical sidewalls of the bottom electrode material and the top electrode material in the intersection.

7. The semiconductor structure of claim 5, wherein:

the bottom electrode material extends orthogonally through the top electrode material; and the bottom electrode material and the top electrode material each contact at least a second ReRAM cross-point cell for a ReRAM crossbar array.

8. The semiconductor structure of claim 1, wherein semiconductor structure is a three-dimensional metal-insulator-metal capacitor.

9. The semiconductor structure of claim 8, wherein the dielectric material is between four vertical sides of the bottom electrode material and the top electrode and a horizontal surface of the dielectric material between the bottom electrode material and the top electrode material in the intersection.

10. The semiconductor structure of claim 8, wherein the three-dimensional metal-insulator-metal capacitor has a same horizontal area as the horizontal surface of the first notch in the bottom portion of the portion of the top electrode.

11. The semiconductor structure of claim 8, wherein:

the bottom electrode material extends orthogonally to the top electrode material; and the bottom electrode material and the top electrode material each contact at least a second three-dimensional metal-insulator-metal capacitor in a three-dimensional metal-insulator-metal capacitor crossbar array.

12. A semiconductor structure comprising:

a first bottom electrode in a first interlayer dielectric material, wherein a first notch is in a top portion of the first bottom electrode at an intersection of the first bottom electrode and a top electrode;

a first layer of a dielectric material directly contacting the first bottom electrode and a top surface of the first interlayer dielectric material, wherein the first layer of dielectric material is between five sides of the first bottom electrode and a bottom portion of the top electrode is at the intersection of the first bottom electrode and the top electrode;

the top electrode directly on the first layer of dielectric material, wherein a second notch in the bottom portion of the portion of the top electrode at the intersection of the first bottom electrode and the top electrode;

a second layer of the dielectric material directly on the top electrode and a second layer of the interlayer dielectric material, wherein the second layer of dielectric material between five sides of a top portion of the top electrode and a bottom portion of a second bottom electrode at an intersection of the top electrode and the second bottom electrode; and the second bottom electrode surrounds a portion of the second layer of the dielectric material on the top portion of the top electrode material, wherein a third notch in the bottom portion of the second bottom electrode is at the intersection of the top electrode and the second bottom electrode.

13. The semiconductor structure of claim 12, wherein the dielectric material is a high-k dielectric material.

14. The semiconductor structure of claim 12, wherein the top electrode is a bit line, and wherein the first bottom electrode and the second bottom electrode are word lines.

15. The semiconductor structure of claim 14, further comprising the semiconductor structure is a double-stacked resistive random-access memory (ReRAM) cross-point cell.

16. The semiconductor structure of claim 14, wherein the first layer of the dielectric material is between the five sides of the first bottom electrode and the bottom portion of the top electrode in a first ReRAM cross point cell, and wherein the second layer of the dielectric material is between the five sides of the top portion of the top electrode material and the bottom portion of the second bottom electrode in a second ReRAM cross point cell.

17. The semiconductor structure of claim 16, wherein the double-stacked ReRAM cross-point cell has the first layer of the dielectric material between the five sides of the portion of the first bottom electrode and the bottom portion of the top electrode and the second layer of the dielectric material is between the five sides of a top portion of the portion of the top electrode material and the bottom portion of second bottom electrode.

18. The semiconductor structure of claim 16, wherein the second ReRAM cross point cell is vertically aligned with the first ReRAM cross point cell.

19. The semiconductor structure of claim 12, further comprising the semiconductor structure is a double-stacked three-dimensional MIM capacitor.

20. A method of forming a semiconductor structure, the method comprising:

depositing a bottom electrode material in a first trench of an interlayer dielectric material;

depositing a layer of an optical planarization material (OPL);

patterning the OPL;

recessing a portion of the bottom electrode material;

etching a second trench orthogonal to the first trench, wherein the second trench extends over the recessed portion of the bottom electrode, wherein the second trench recesses a portion of the interlayer dielectric directly abutting the recessed portion of the bottom electrode;

removing the OPL;

depositing a layer of a dielectric material over the semiconductor structure;

depositing a top electrode material over the dielectric material, wherein a portion of the top electrode material covers sidewalls of the recessed portion of the bottom electrode material; and performing a chemical mechanical polish using the dielectric material as an etch stop.

* * * * *